(12) United States Patent
Messina

(10) Patent No.: US 10,826,152 B2
(45) Date of Patent: Nov. 3, 2020

(54) BROADBAND RADIO FREQUENCY COUPLER

(71) Applicant: ANALOG DEVICES, INC., Norwood, MA (US)

(72) Inventor: Anthony P. Messina, Boston, MA (US)

(73) Assignee: Analog Devices, Inc., Norwood, MA (US)

( * ) Notice: Subject to any disclaimer, the term of this patent is extended or adjusted under 35 U.S.C. 154(b) by 164 days.

(21) Appl. No.: 16/113,182

(22) Filed: Aug. 27, 2018

(65) Prior Publication Data

US 2019/0067785 A1 Feb. 28, 2019

Related U.S. Application Data

(60) Provisional application No. 62/551,617, filed on Aug. 29, 2017.

(51) Int. Cl.
| | |
|---|---|
| *H01P 5/18* | (2006.01) |
| *H01P 3/08* | (2006.01) |
| *G01R 21/00* | (2006.01) |
| *H01P 1/30* | (2006.01) |
| *G01R 27/06* | (2006.01) |

(52) U.S. Cl.
CPC ............ *H01P 5/187* (2013.01); *G01R 21/00* (2013.01); *H01P 3/081* (2013.01); *G01R 27/06* (2013.01); *H01P 1/30* (2013.01)

(58) Field of Classification Search
CPC .. H01P 5/18; H01P 5/185; H01P 5/187; H01P 3/08; H01P 3/084
USPC ........................................ 333/109–112, 116
See application file for complete search history.

(56) References Cited

U.S. PATENT DOCUMENTS

| | | | | |
|---|---|---|---|---|
| 3,617,952 A | * | 11/1971 | Beech | ..................... H01P 5/185 333/116 |
| 4,999,593 A | | 3/1991 | Anderson | |
| 5,006,821 A | | 4/1991 | Tam | |
| 5,012,209 A | * | 4/1991 | Lantagne | ................ H01P 5/185 333/116 |
| 5,212,815 A | | 5/1993 | Schumacher | |
| 6,731,244 B2 | | 4/2004 | Killen | |
| 7,002,433 B2 | | 2/2006 | Antkowiak | |
| 7,009,467 B2 | * | 3/2006 | Sawicki | .................. H01P 5/185 333/116 |
| 7,429,903 B2 | | 9/2008 | Antkowiak | |
| 7,961,064 B2 | | 6/2011 | Kearns | |

(Continued)

OTHER PUBLICATIONS

A. Fackelmeler et al., Broadband Directional Coupler with High Coupling Attenuation, MeMiC 2014, Mar. 10-12, 2014, Aachen, Germany.

(Continued)

*Primary Examiner* — Dean O Takaoka
(74) *Attorney, Agent, or Firm* — Knobbe, Martens, Olson & Bear, LLP

(57) ABSTRACT

An apparatus for processing radio frequency (RF) signals includes a housing with a cavity. In the cavity, a stripline is configured to carry the RF signal. The stripline is on a substrate and suspended in the cavity. One or more coupled lines, which can be forward and reverse directional microstrip couplers, are electromagnetically coupled to the stripline and receive an attenuated version of the RF signal. The couplers can have a stair step design or asymmetric design to enhance directivity.

20 Claims, 16 Drawing Sheets

(56) References Cited

U.S. PATENT DOCUMENTS

| | | |
|---|---|---|
| 8,289,102 B2 | 10/2012 | Yamamoto |
| 8,797,121 B2 | 8/2014 | Ezzeddine |
| 9,184,484 B2 | 11/2015 | Tanbakuchi |
| 2003/0132813 A1 | 7/2003 | Gottschalk |
| 2004/0041657 A1* | 3/2004 | Paakkonen ............. H01P 5/185 333/116 |
| 2010/0277369 A1 | 11/2010 | Gunton |
| 2014/0375395 A1 | 12/2014 | Suga |
| 2018/0083336 A1* | 3/2018 | Weale ..................... H01P 5/185 |

OTHER PUBLICATIONS

S. Lin et al., Development of wideband low-loss directional coupler with suspended stripline and microstrip line, Electronic Letters, Dec. 8, 2011, vol. 47, No. 25.

* cited by examiner

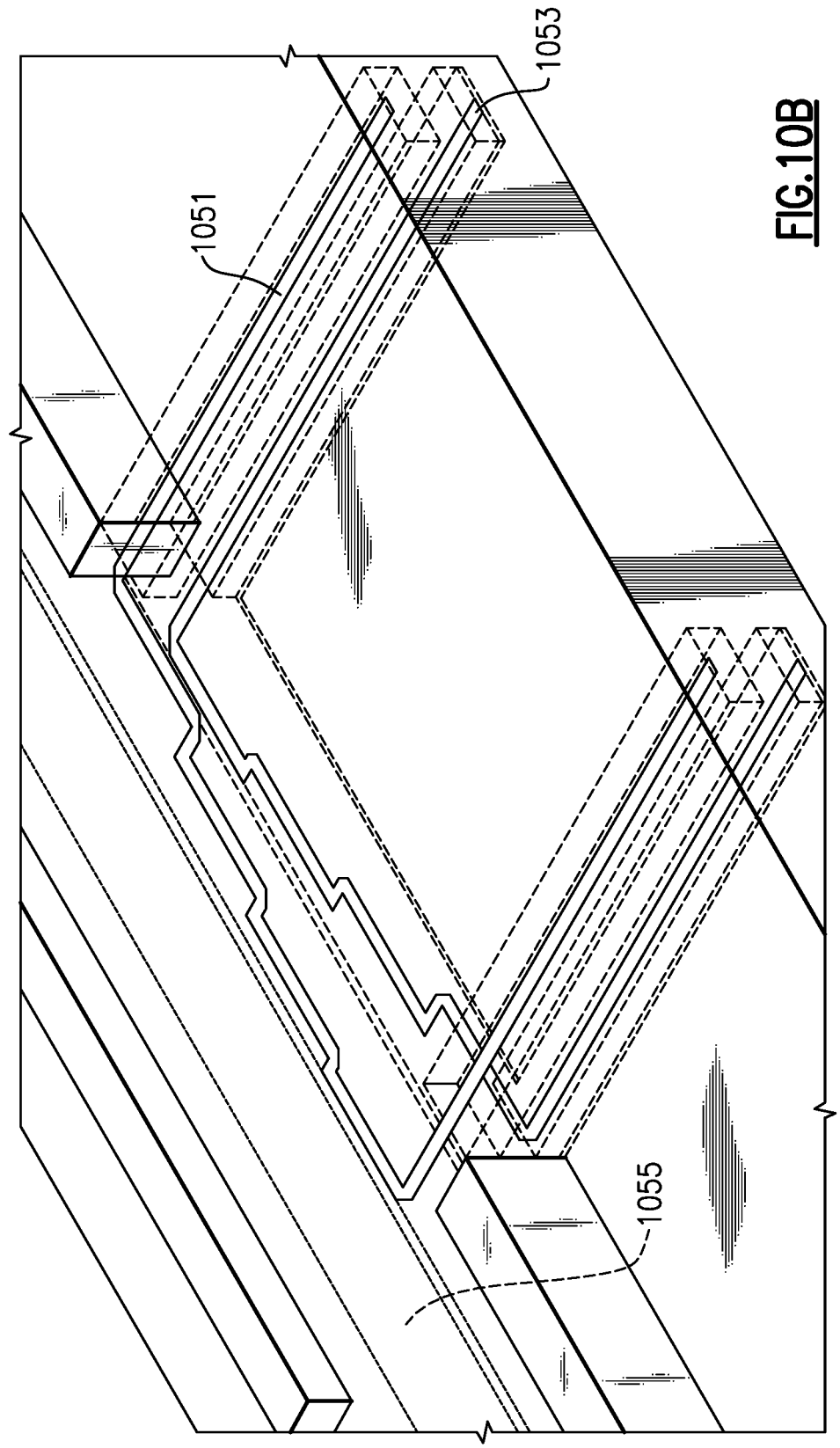

BROADBAND RADIO FREQUENCY COUPLER

REFERENCE TO RELATED APPLICATIONS

This disclosure references various features of and claims the benefit of priority to U.S. Provisional Patent Application No. 62/551,617, filed on Aug. 29, 2017, the entirety of which is hereby made a part of this application as if set forth fully herein and incorporated by reference for all purposes, for all that it contains.

TECHNICAL FIELD

Embodiments of the disclosure generally relate to couplers for radio frequency signals, and more particularly, to relatively compact directional couplers for broadband radio frequency signals outputted from power amplifiers.

BACKGROUND

Radio frequency (RF) couplers are frequently used in connection with power amplifiers and related circuits for monitoring operating characteristics. Existing RF couplers tend to be rather large and costly to manufacture and/or have limitations in a variety of operating parameters, such as power, loss, bandwidth, sensitivity, operating conditions, and the like.

SUMMARY

The systems, methods, and devices described herein each have several aspects, no single one of which is necessarily responsible for all of its improvements or advantages. Thus, the invention can be embodied or carried out in a manner that achieves or optimizes one advantage or group of advantages as taught herein without necessarily achieving other advantages as can be taught or suggested herein. Without limiting the scope of this disclosure, several non-limiting features are briefly discussed.

Some aspects feature an apparatus for processing radio frequency (RF) signals, the apparatus comprising: a housing including a cavity, a substrate assembly, and a second line within the cavity. The substrate assembly can include: a dielectric substrate and a first conductive line configured to carry a first RF signal, wherein at least a portion of the substrate assembly including at least a portion of the first conductor is suspended within a cavity of the housing. The second conductive line within the cavity can be spaced apart from the substrate assembly by air, the second conductive line arranged in a microstrip configuration with a dielectric and a ground plane facing away from the first conductive line, wherein the second conductive line is RF coupled to the first conductive line such that the second conductive line carries an attenuated version of the first RF signal as a second RF signal.

The apparatus can further include one, any combination of, or all of the following features. The second conductive line has one or more steps for one or multi-octave RF coupling. The second conductive line has two or more steps for multi-octave RF coupling. The second conductive line has three or more steps for multi-octave RF coupling. The two or more steps of the second conductive line are symmetric. The two or more steps of the second conductive line are asymmetric for directional coupling. The apparatus further includes a third conductive line within the cavity, but spaced apart from the substrate assembly and apart from the second conductive line, wherein the third conductive line is arranged in a microstrip configuration with a dielectric and a ground plane facing away from the first conductive line and on a side of the substrate assembly opposite to the second conductive line, wherein the third conductive line is RF coupled to the first conductive line such that the third conductive line carries an attenuated version of the first RF signal as a third RF signal. The substrate assembly further comprises thermal shunts configured to draw heat away from the first conductive line. The housing comprises an electrically conductive material. At least a portion of the housing comprises an electrically conductive material such that the cavity of the housing is shielded from outside the housing. The first conductive line and the second conductive line are configured to carry the first RF signal and the second RF signal, respectively in a transverse electromagnetic (TEM) mode. The apparatus further includes an RF power combiner. The apparatus further includes: one or more N-type connectors mechanically attached to the housing and electrically connected to the first conductive line; and one or more SubMiniature version A (SMA) connectors mechanically attached to the housing and electrically connected to the second conductive line.

Other aspects feature an apparatus for processing radio frequency (RF) signals, the apparatus comprising: a housing; a substrate disposed within a cavity of the housing; a suspended stripline coupled to the substrate, the suspended stripline also disposed within the cavity of the housing; and a first microstrip coupler disposed within the cavity, wherein the first microstrip coupler is RF coupled to the suspended stripline, and wherein at least a portion of the suspended stripline is on a side of the substrate that faces the first microstrip coupler.

The apparatus of the above paragraph can further include one, any combination of, or all of the following features. The first microstrip coupler has one or more steps for multi-octave RF coupling. The first microstrip coupler has two or more steps for multi-octave RF coupling. The first microstrip coupler has three or more steps for multi-octave RF coupling. The first microstrip coupler is preferentially coupled in a forward direction, the apparatus further comprising a second microstrip coupler disposed within the cavity, wherein the second microstrip coupler is preferentially RF coupled to the suspended stripline in a reverse direction. A dielectric substrate for the suspended stripline comprises a material suitable for high power and a dielectric substrate for the first microstrip coupler comprises a different material.

Other aspects feature a system for detecting transmission of radio frequency (RF) power, the system comprising: a housing; a plurality of suspended stripline sections disposed within a cavity of the housing, each of the plurality of suspended stripline sections configured to receive one of a plurality of RF signals; a first suspended stripline section disposed within a cavity of the housing, the first suspended stripline section configured to receive a combination of the plurality of RF signals; a first microstrip coupler disposed within the cavity, wherein the microstrip coupler is RF coupled to the first suspended stripline section and separated from the first suspended stripline section by air; and a detector coupled to the microstrip coupler.

The system can also include a second microstrip coupler disposed within the cavity, wherein the second microstrip coupler is a directional coupler of a second direction, and wherein the first microstrip coupler is a directional coupler of a first direction.

BRIEF DESCRIPTION OF THE DRAWINGS

FIG. 10B shows a perspective view of two microstrip coupling lines in an example dual directional coupler according to some embodiments.

DETAILED DESCRIPTION

Figure 1:
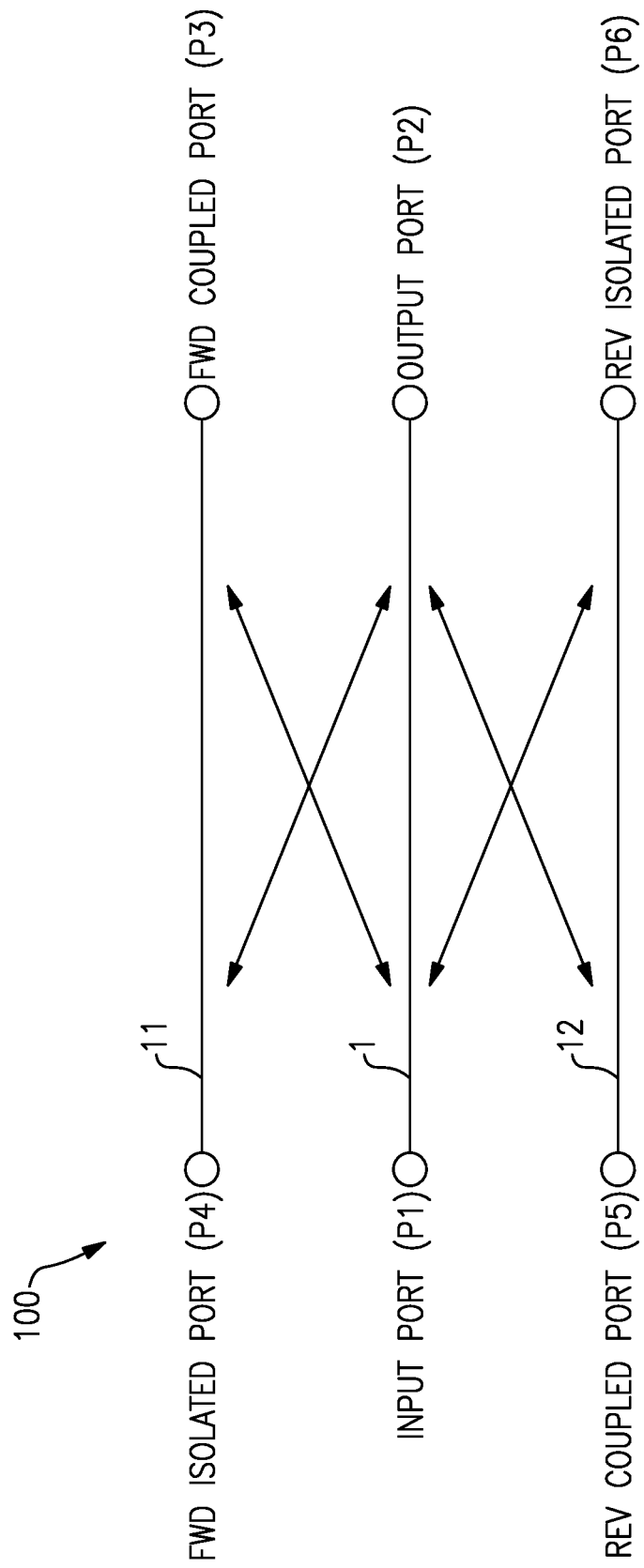
FIG. 1 is a schematic diagram depicting example port definitions of a dual directional coupler according to some embodiments.

Although particular embodiments are described herein, other embodiments, including embodiments that do not provide all of the benefits and features set forth herein, will be apparent to those of ordinary skill in the art.

Overview

A directional coupler includes a through line for passing a radio frequency (RF) signal, and at least one coupled line for sampling the RF signal. For example, the coupled line can operate to couple a portion of the electromagnetic wave propagating along the through line. The coupled RF signal can be used for a wide variety of purposes including, but not limited to, monitoring RF signal power for transmit power control and/or adaptation of predistortion techniques.

In certain implementations, an RF coupler is implemented as a dual directional coupler, which includes a first coupled line for coupling a portion of the RF signal propagating along the through line in a forward direction, and a second coupled line for coupling a portion of the RF signal propagating along the through line in a reverse direction. By including a dual directional coupler in an RF system, a number of parameters of the RF system can be detected or monitored, including, but not limited to, forward power, reverse power, voltage standing wave ratio (VSWR), and/or reflection coefficient. In certain implementations, the first coupled line and the second coupled line are orientated in opposite directions to achieve enhanced directivity in sensing forward and reverse RF signal waves.

A directional coupler can be included along a signal path between an output of a power amplifier and an antenna, thereby providing a mechanism for detecting power of wireless transmissions. Furthermore, when a dual directional coupler is included along the signal path between the power amplifier's output and the antenna, the dual directional coupler can serve to monitor both the level of RF signal power being outputted from the power amplifier and the level of reflected power sent back into the power amplifier due to mismatches, such as impedance mismatches at the antenna. Absent detection and compensation for such mismatches (for instance, via antenna tuning and/or power amplifier output tuning), a high level of reflected power can degrade system performance and/or potentially damage the power amplifier, for instance, due to large standing wave conditions.

A coaxial connectorized dual directional coupler or two connectorized directional couplers facing in opposite directions can be used to perform high power measurements of forward and reverse RF signal waves. However, the presence of one or more couplers and/or connectors (for instance, connectorized ports) along the signal path introduces insertion loss that degrades transmit power level and/or other performance characteristics, such as signal bandwidth.

Moreover, certain directional couplers for high power broadband applications are prohibitively large. In one example, a high power broadband 2 to 18 GHz coaxial coupler is about 5 inches long. Such directional couplers occupy considerable space in a system, which can be particularly cumbersome and/or costly in applications including multiple couplers, such as certain power combining systems.

Broadband radio frequency couplers are provided herein. In certain embodiments, an RF coupler includes a stripline that operates as a through line of the RF coupler and a microstrip transmission line that operates as coupled line of the RF coupler. Thus, the through line and the coupled line are implemented using different planar transmission line technologies. The stripline is suspended in an air cavity, and separated from the microstrip transmission line by an air gap.

By implementing the RF coupler in this manner, a number of advantages are achieved. For example, the air cavity provides relatively low dielectric loss tangent, and thus RF signals propagate along the stripline with relatively low dissipation of electromagnetic energy, which in turn results in the RF coupler having relatively low insertion loss. Furthermore, the stripline can operate as a waveguide for transverse electromagnetic (TEM) waves, which can provide relative wide bandwidth and/or robust signaling characteristic relative to quasi-TEM and/or certain other types of wave propagation. Thus, the RF coupler is suitable for high power, wide bandwidth, and/or high performance applications.

Moreover, the suspended stripline to microstrip directional coupler is relatively compact, and thus can be readily integrated into a wide variety of RF systems, including, but not limited to power combining systems (for instance, suspended stripline combining networks) used to combine RF signals outputted form two or more power amplifier modules. For example, high power N-type connectors can be included to connect one or more couplers to solid-state or traveling-wave tube power amplifier amplifiers, thereby achieving measurement capability in a wide range of high power systems.

In certain implementations, a pair of microstrip transmission lines are included on opposite sides of the stripline and serve to detect forward and reverse RF signal waves. Thus, the teachings herein are applicable to a wide range of RF couplers, including but not limited to, directional couplers and dual directional couplers. In certain implementations, the pair of microstrip transmission lines are placed along a common section of the suspended stripline, thereby enhancing compactness.

The coupler's microstrip transmission line(s) can be implemented in a wide variety of ways. In certain implementations, a microstrip transmission line includes two or more sections having different amounts of spacing from the suspended stripline. For example, the microstrip transmission line can include two or more steps to provide spacing from the suspended stripline that gradually increases (or decreases) along the length of the stripline, thereby enhancing the bandwidth and directivity. In certain implementations, a width of each section controls a center frequency of the RF coupler. In one example, each section has a length of about ¼ a wavelength at the desired frequency of operation of the RF coupler. Accordingly, certain directional couplers herein advantageously have frequency characteristics that are tunable by selection of geometric features or dimensions.

In certain implementations, a pair of microstrip transmission lines are included, each having two or more sections with different spacing to the suspended stripline. Additionally, the spacing of a first microstrip transmission line of the pair gradually increases along the length of the stripline, while the spacing of a second microstrip transmission line of the pair gradually decreases along the length of the stripline. Implementing the microstrip transmission lines in this manner aids in detecting forward and reverse RF signal waves with enhanced directivity and/or accuracy. A microstrip transmission line is also referred to herein as a microstrip line or a microstrip configuration.

In some embodiments, a broadband high power suspended stripline to microstrip directional coupler includes a pair of microstrip transmission lines that are asymmetrically electromagnetically coupled to a high power, low loss through suspended stripline. In certain implementations, the suspended stripline is formed on a suspended stripline substrate, while the pair of microstrip transmission lines are formed on separate microstrip coupling substrates that are positioned on opposite sides of the suspended stripline substrate. Thus, in this embodiment, three or more substrates are included and separated from one another by air. In certain implementations, the substrates are enclosed in a housing, which can be, for example, a metal enclosure (for instance, a silver plated aluminum enclosure).

The coupler's stripline can be implemented in a wide variety of ways. In certain implementations, the stripline is formed on a suspended stripline substrate that is positioned in an air cavity. For example, the suspended stripline substrate can include a first conductor on a first side of the substrate, a second conductor on a second side of the substrate, and a plurality of vias that provide electrical connections between the first conductor and the second conductor at regular or irregular intervals.

By including a pair of conductors on opposing sides of the suspended stripline substrate, symmetry of the electromagnetic field of the RF signal is maintained, thereby reducing or eliminating a performance impact arising from variation in substrate thickness and/or substrate dielectric constant. Furthermore, implementing the stripline in this manner can stabilize operation over temperature, achieve a high quality factor (Q-factor), and/or provide low through loss, which in turn leads to lower heat generation and/or higher power handling capability.

To provide further enhancement to heat dissipation characteristics and/or power handling capability, in certain implementations thermal shunts are included along the stripline. For example, in certain implementations, the thermal shunts are formed of dielectric structures (for instance, ceramic) that thermally couple the stripline to a ground plane. Implementing the thermal shunts in this manner aids in electrically isolating the stripline from the ground plane while providing a low thermal impedance path for heat generated in the stripline to flow to the metal enclosure or other housing.

In certain implementations, a width of the stripline is varied at or near locations of the thermal shunts, thereby compensating for variation in characteristic impedance of the stripline arising from presence of the thermal shunts. In one example, the stripline includes notches or regions of reduced width where the thermal shunts are present, thereby maintaining a substantially constant characteristic impedance to inhibit signal reflection and/or stripline discontinuities.

In certain implementations, the dimension of the air cavity is selected to inhibit undesired resonances. For example, when a stripline is suspended in a very large air cavity, higher mode resonances can result, which can degrade performance of the RF coupler, such as the coupler's bandwidth. In certain implementations, the air cavity has a nominal width selected to reduce or eliminate frequency resonances. In one example, the nominal width is less than or equal to 300 mils with a height of about 100 mils. Although one example of nominal cavity width has been provided, nominal width can vary based on a wide variety of factors, such as application, implementation, cavity height, and/or desired operating frequency.

In certain implementations, a width of the cavity increases relative to the nominal width in a location of the coupling section to provide space for one or more microstrip transmission lines that provide coupling. To inhibit frequency resonances from being generated by the local increase in cavity width, a mode-suppression structure is included substantially opposite the coupler section. The mode-suppression structure effectively shifts the through line cavity, thereby reducing or eliminating frequency resonances while maintaining sufficient space for the microstrip coupler to couple the through line and maintain high directivity.

To enhance isolation, the RF coupler is implemented with one or more ground planes. In certain implementations, a ground pour on the suspended stripline substrate is used as an isolating ground plane. Implementing the RF coupler in this manner isolates leakage between the forward and reverse microstrip couplers, and provides shielding between forward coupled, forward isolated, reverse coupled, and reverse isolated ports. Additionally or alternatively, a housing of the directional coupler serves as a ground plane.

In certain implementations, an RF coupler is used to transfer a relatively small portion of RF power from a first transmission line to a second transmission line implemented by different planar transmission line technologies. An RF coupler can be directional, such that more RF power is coupled in a first direction versus a second direction. Disclosed herein is a technique to couple RF power in an advantageously compact manner with improved operating parameters.

While certain embodiments are illustrated in the context of dual directional couplers in the 2-18 gigahertz (GHz) range, the principles and advantages described herein are also applicable to single couplers, to non-directional couplers, and to couplers having different frequency ranges. For instance, the RF couplers herein can be used for coupling of RF signals of a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF systems, including microwave systems.

The RF couplers herein can be used in a wide variety of applications, including, but not limited to, military systems, test equipment, and/or radar systems. The RF signals handling by the RF coupler can be associated with a wide variety of signal types, including, proprietary and non-proprietary signaling standards.

FIG. 1 is a schematic diagram depicting example port definitions of a dual directional coupler 100 according to some embodiments.

The dual directional coupler 100 includes a through line 1 which passes an RF signal. The dual directional coupler also includes a first or forward coupled line 11 and a second or reverse coupled line 12 which sample the RF or microwave signal by electromagnetically coupling (without a direct, electrically conductive connection to) a portion of the electromagnetic wave that is propagating along the through line 1.

In certain implementations, the coupled lines 11, 12 are oriented in opposite directions to directionally sample signals propagating in both directions along the through line. For example, in transmitter applications, a dual directional coupler is often present between a high power RF amplifier and an antenna. The dual directional coupler 100 can be used to monitor the power being transmitted from the amplifier. The dual direction coupler 100 can also be used to measure the level of reflected power sent back into the amplifier due to mismatches in the system. Such mismatches can degrade the system performance and/or potentially damage the amplifier.

As shown in FIG. 1, the dual directional coupler 100 includes an input port P1 of the through line 1, an output port P2 of the through line 1, a forward coupled port P3 of a forward coupled line 11, a forward isolated port P4 of the forward coupled line 11, a reverse coupled port P5 of the reverse coupled line 12, and a reverse isolated port P6 of the reverse coupled line 12. The arrows indicate the direction of coupling between ports, according to certain implementations. Ports indicated as isolated (P4 and P6) can be terminated with 50 ohm resistors (or other suitable system impedance) to ground to improve the coupling flatness and/or directivity of the coupled ports.

Although a dual directional coupler 100 is illustrated in FIG. 1, the teachings herein are applicable to a wide variety of types of RF couplers.

Figure 2:
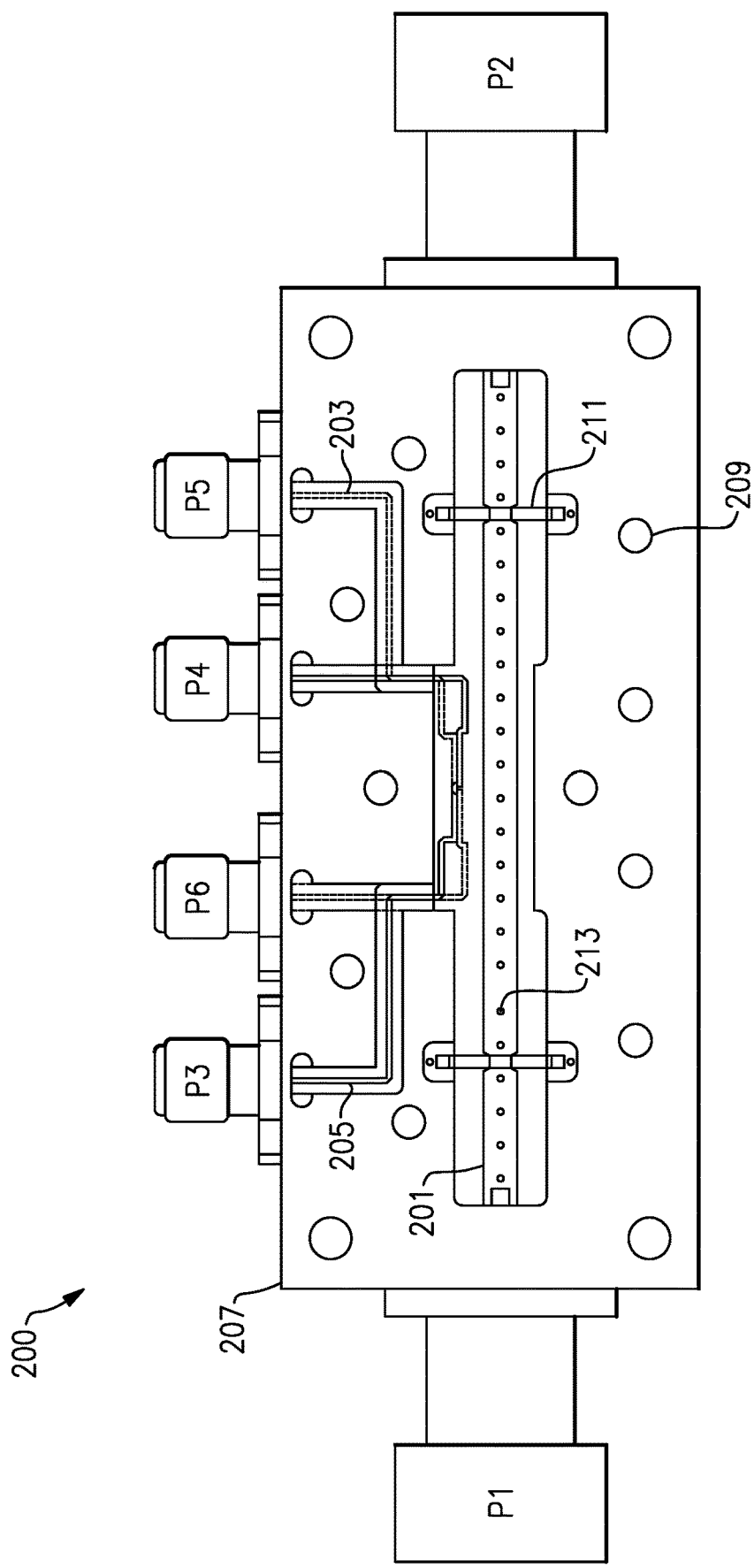
FIG. 2 is a top down view of a dual directional coupler according to some embodiments.

FIG. 2 is a top down view of a dual directional coupler 200 according to some embodiments.

Figure 9:
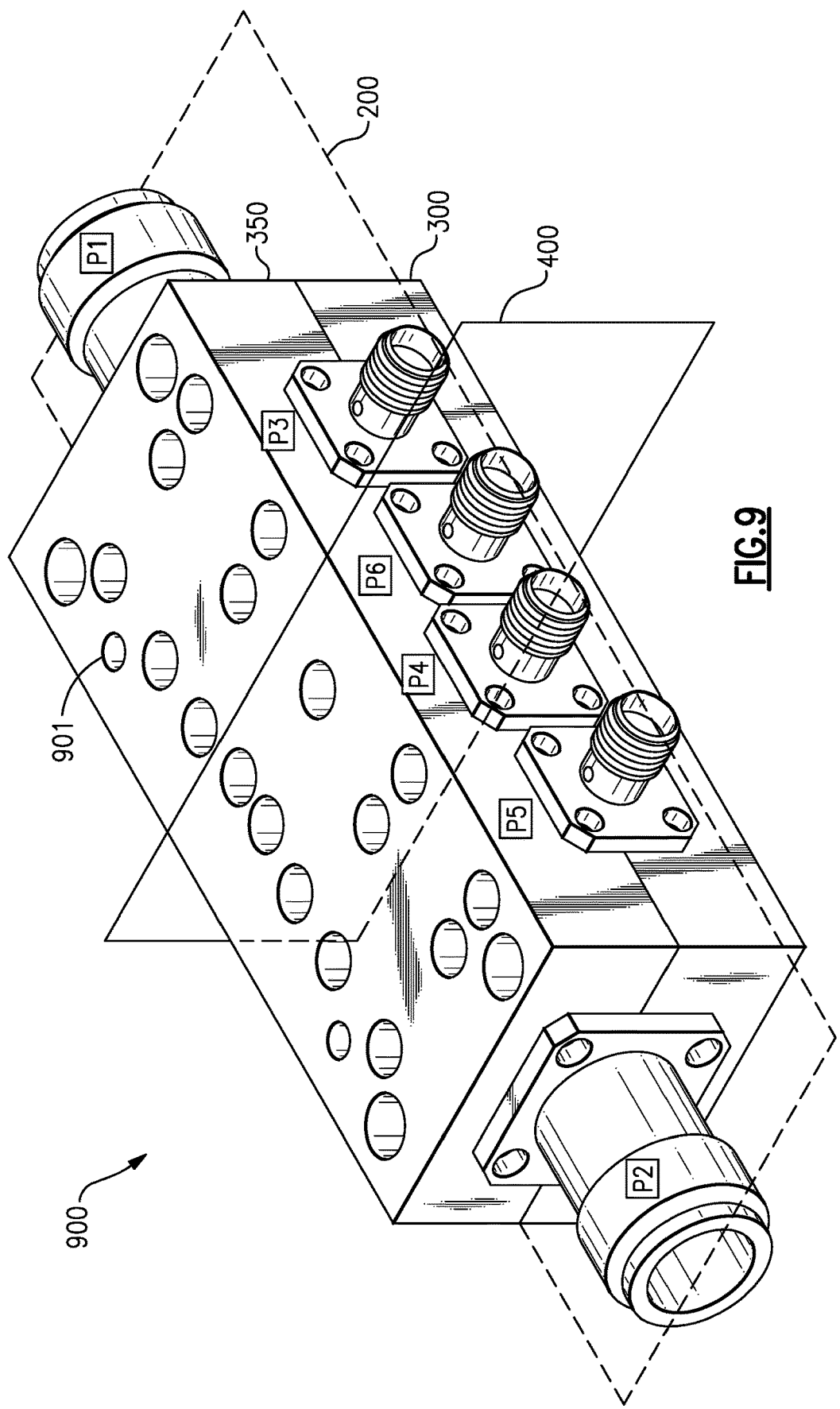
FIG. 9 shows the exterior of an assembled dual directional coupler according to some embodiments.

The dual directional coupler 200 of FIG. 2 shows a wire frame top down view, which in some embodiments corresponds to a rotated view of the cross-section 200 shown in FIG. 9. The dual directional coupler 200 of FIG. 2 includes a through line 201, a reverse coupled line 203, a forward coupled line 205, connectors P1-P6, an outline of the housing 207 (implemented as metal plates, in certain implementations), pillars or holes 209 for alignment, thermal shunts 211, vias 213, and mounting holes 217 for securing the dual directional coupler 200 to another structure. Ground planes have been omitted from this figure and the housing 207 has been made transparent for clarity in viewing the through and coupled lines.

Although an embodiment of an RF coupler is depicted in FIG. 2, the teachings herein are applicable to RF couplers implemented in a wide variety of ways. For example, any of the dual directional couplers disclosed herein can be implemented as a single directional coupler by omitting a coupled line and associated structures.

The through line 201 can be a stripline that passes through and is suspended in a cavity in the housing 207 from port P1 to port P2. The through line 201 can be a strip of conductive material for carrying an RF or microwave signal. In certain implementations, the through line 201 is formed on a suspended stripline substrate. Additionally, the suspended stripline substrate includes a first conductor on a first side of the substrate and a second conductor on a second side of the substrate, and the vias 213 provide electrical connections between the first conductor and the second conductor.

By including a pair of conductors on opposing sides of the suspended stripline substrate, symmetry of the electromagnetic field of the RF signal is maintained, thereby reducing or eliminating a performance impact arising from variation in substrate thickness and/or substrate dielectric constant. Furthermore, implementing the stripline in this manner can stabilize operation over temperature, achieve high quality factor (Q-factor), and/or provide low through loss, which in turn leads to lower heat generation and/or higher power handling capability.

The illustrated embodiment also includes thermal shunts 211, which enhance heat dissipation characteristics and/or power handling capability. In certain implementations, the thermal shunts 211 are formed of dielectric structures (for instance, ceramic) that provide a low thermal impedance path for heat to flow from the through line 201 to the housing 207.

As shown in FIG. 2, a width of the through line 201 is varied at locations of the thermal shunts 211, thereby compensating for variation in characteristic impedance of the through line 201 arising from presence of the thermal shunts 211. In the illustrated embodiment, regions 215 of reduced width are included, and operate to maintain a substantially constant characteristic impedance of the through line 201 to inhibit signal reflection and/or stripline discontinuities.

In certain implementations, ports P1 and P2 can be N-type connectors or other type of connectors for high power RF or microwave signals. As further discussed with respect to FIG. 4 and FIG. 7, the through line 201 can be a stripline formed on one or metal layers on a surface of a substrate or circuit board. For example, the through line 201 can run on both sides of the substrate or circuit board to accommodate additional power and/or provide TEM propagation for enhanced signaling performance. Vias 213 through the substrate or circuit board can be used to connect the through line 201 on either side of the substrate or circuit board. The thermal shunt 211 can pass over the through line 201 to couple surfaces on opposite sides of the through line 201. The thermal shunt is further described with respect to FIG. 8.

The pillars or holes 209 can be used for alignment. In one example, the housing 207 is implemented using two parts (for instance, two halves), and one of the two or parts has a pillar or via that mates with a respective hole in the other part of the housing assembly 207. Some holes 217 can be screw holes for receiving screws to hold the housing 207 together or for screwing the housing 207 to another surface.

Figure 3:
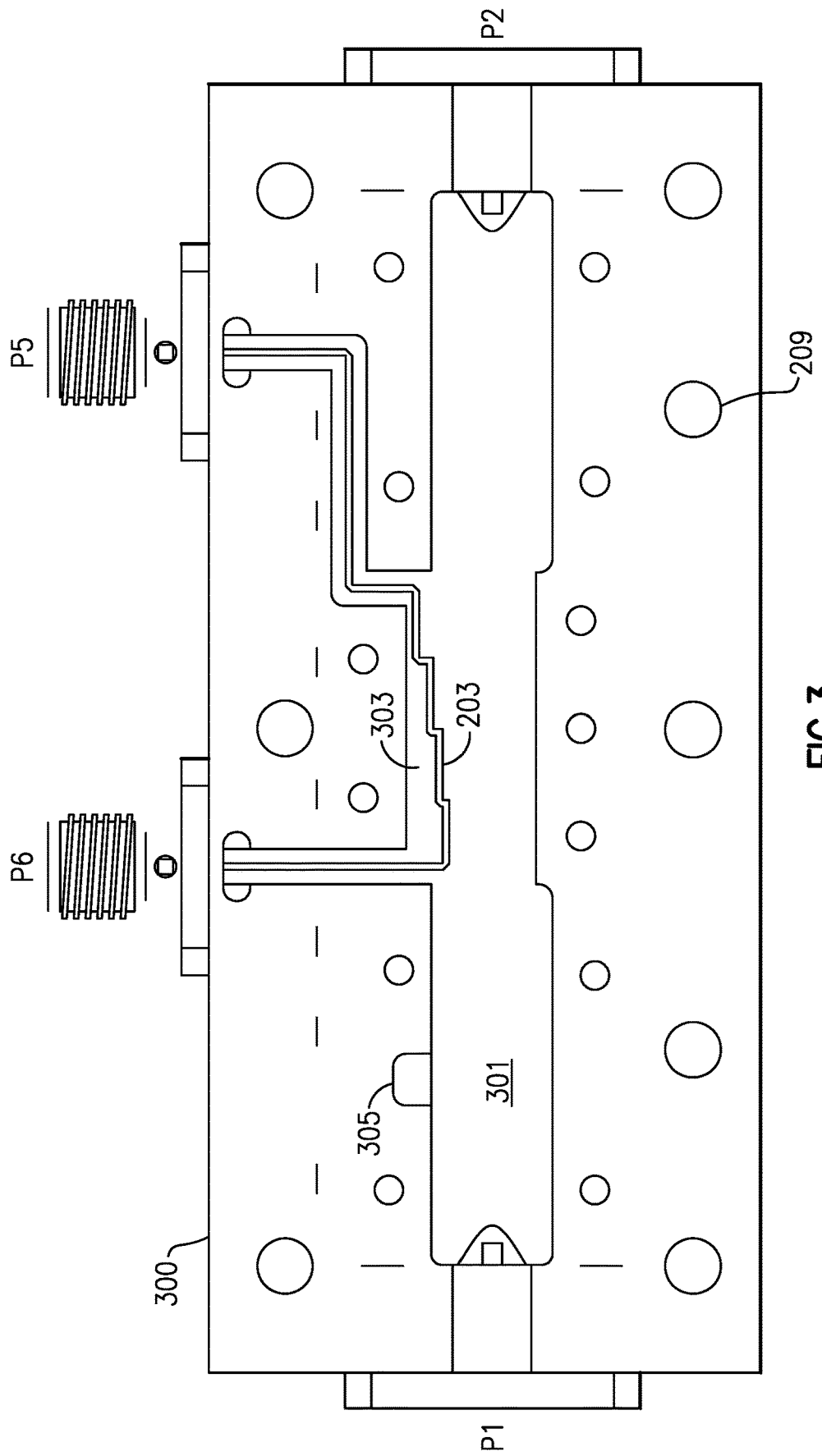
FIG. 3 shows a bottom plate of a housing assembly and a microstrip coupler for a dual directional coupler according to some embodiments.

The reverse and forward coupled lines 203 and 205 pass from port P3 to port P4 and from port P5 to port P6, respectively. Although the coupled lines 203 and 205 are shown as overlapping in FIG. 2, the coupled lines 203 and 205 are separated from each other to provide isolation. The coupled lines 203 and 205 can pass through in separate parts or separate halves of the housing 207. For example, the coupled line 203 can pass through half of the housing 300 as shown in FIG. 3 and also shown as the bottom half of the housing 300 in FIG. 9. For example, the coupled line 205 can pass through half of the housing 350 as shown in FIG. 9.

Figure 6:
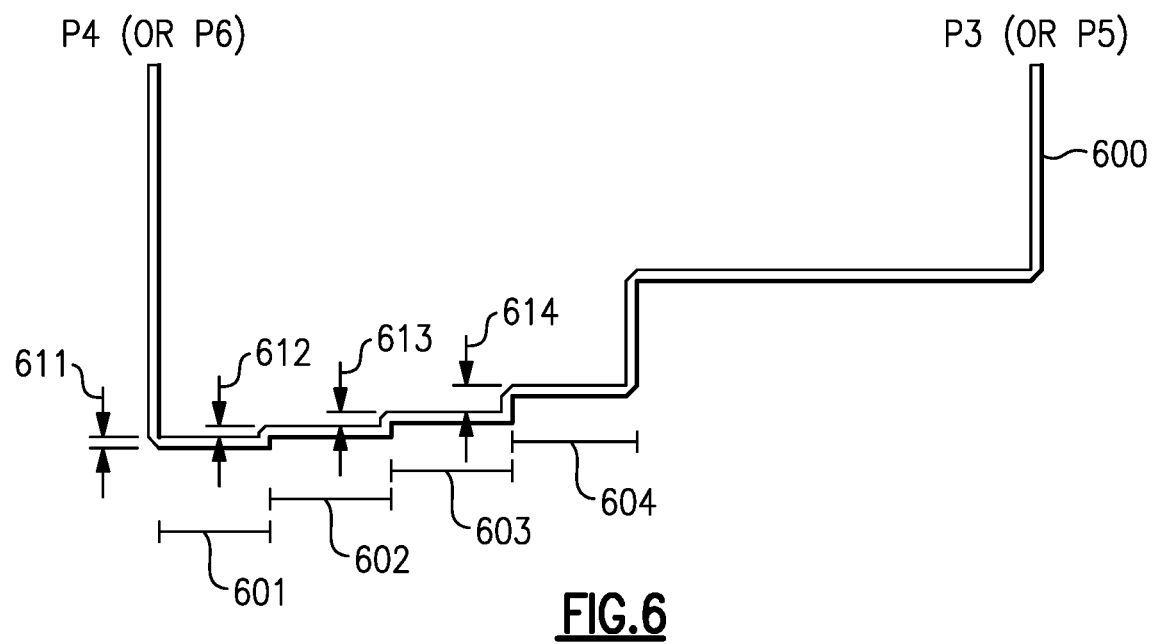
FIG. 6 illustrates an embodiment of an asymmetrical microstrip coupling line.

Some implementations of the shape of the coupled lines 203 and 205 are discussed further with respect to FIG. 6. The ports P3-P6 can be 2.92 mm SubMiniature version A (SMA) connectors, coaxial RF connectors, or any other suitable type of connectors for high power RF or microwave signals. In some embodiments, the ports P3-P6 can be designed for lower power signals than ports P1 and P2. The housings 207 can include a cavity shape for the coupled lines 203 and 205 such that the coupled lines 203 and 205 are also suspended in the air (or nonconductive gas or vacuum) of the cavity shape.

The illustrated embodiment of a broadband high power suspended stripline to microstrip directional coupler includes two microstrip transmission lines which are asymmetrically electromagnetically coupled to a high power, low loss through suspended stripline. The asymmetry provides directionality. However, in alternative embodiments, the microstrip couplers can be symmetric. In some embodiments, the coupler features three substrates inside a metal enclosure or housing, which can be made of 6061-T6 aluminum, which can be silver plated to increase the electrical conductivity of the enclosure. Although one example is provided, other conductive materials can be used for the enclosure. In some embodiments, the enclosure has two equal sized plates with a 0.28" wide and 0.045" deep slot machined into each half.

The suspended stripline to microstrip directional couplers disclosed herein is advantageously relatively compact and relatively low loss, and can be easily integrated into suspended stripline combining networks which are often used to combine outputs from several amplifier modules to create a high power solid-state amplifier. High power N-type connectors can also be added to connect the coupler to solid-state or traveling-wave tube amplifiers, for measurements in virtually any high power system.

FIG. 3 shows a bottom plate 300 of a housing assembly and a microstrip coupler for a dual directional coupler according to some embodiments. FIG. 3 includes the reverse coupled line 203, ports P1 and P2 for the RF or microwave signal, ports P5 and P6 for connecting to the reverse coupled line 203, a main cavity 301, a second cavity 303, and a notch cavity 305. The bottom plate 300 is also referred to as a bottom "half" 300 to aid conceptual understanding. However, it should be recognized that the bottom plate and the top plate can but do not necessarily constitute half of the housing assembly in a 50/50 split. Other embodiments can include different numbers of housing parts, such as three or more parts. Furthermore, although described in context to an example housing with multiple parts, the teachings herein are applicable to a wide range of types of housings.

A top plate 350 (not shown in FIG. 3) can be configured to have a forward coupled line and ports in a reversed direction (such as shown in FIG. 2 and FIG. 9). The design can be comprised of two equal plates with microstrip substrates installed. In alternative embodiments, the two plates can be different. These plates are oriented in opposite directions on either side of a center substrate which contains the through line.

The half housing assmembly 300 can be made of a conductive material, such as aluminum, copper, or other metal. In this embodiment, the main cavity 301 is an air cavity, which can include any non-conductive gas and/or a vaccum. By using an air cavity a relatively low dielectric loss tangent is provided, and thus RF signals propagate along the through line with relatively low dissipation of electromagnetic energy and low through loss.

In another embodiment, the main cavity 301 is filled with a low loss dielectric, for instance, a Teflon based dielectric having a dielectric constant of less than about 2.2. Using a low loss dielectric may increase loss but reduce the width and height of the cavity in comparison to the width and height of an air cavity.

The size of the main cavity 301 and the second cavity 303 can be large enough such they encompasses both and provide an air path between the through line and the coupled line 203. In some embodiments, the air cavity can provide at least 50 mils between the through line and the coupled line 203. This distance determines the coupling factor. For example, the coupling factor can decrease with increased distance. The through trace width and subsequency air cavity size can be large enough to handle the power throughput. At the same time, the width and height of the air cavity can remain less than a half wavelength of the highest frequency and be set to a ratio with the through trace width that maintains the correct characteritic impedance. The ports P1 and P2 can connect from outside the half housing assembly 300 through the half housing assembly 300 to the main cavity 301, allowing for the through line to be suspended in the main cavity 301 without the through line being electrically shorted to the housing. The shape of the main cavity can also accommodate a substrate or circuit board that the through line is printed, patterned, or otherwise formed on. The notch cavity 305 is shaped to accommodate an extension of the thermal shunt.

A microstrip line 203 can be connected from port P6 to port P5. The microstrip line 203 can include a portion that runs close enough to and substantailly parallel to the through line (see through line 201 in FIG. 2; through line not shown in FIG. 3) such a current is electormangnetically induced in the microstrip line when a power signal passes through the through line. The portion of the microstrip line 203 that runs parallel can have a "stairstep" shape that is asymmetric along the length of the through line to allow for a directional measurement (further discussed with respect to FIG. 6). The microstrip line 203 can be physically isolated from the through line, such as being separated from the through line by air of the cavity.

Figure 4:
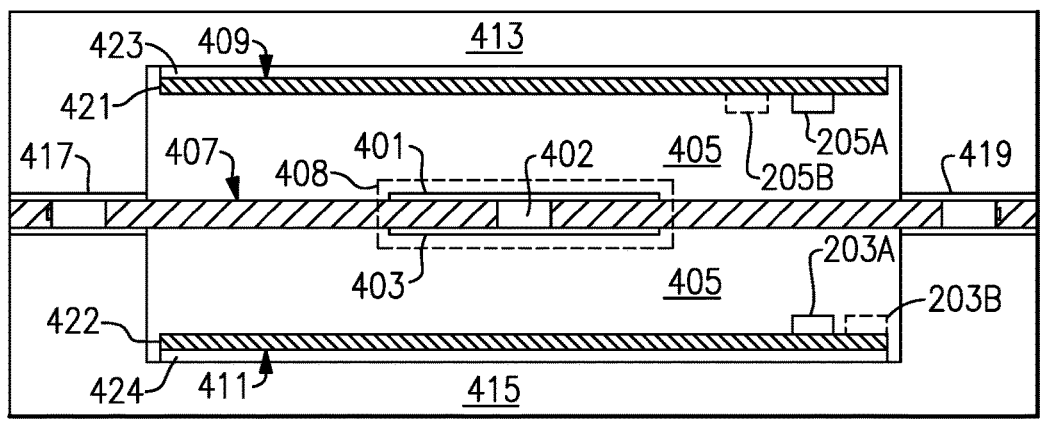
FIG. 4 shows a cross sectional view of a dual directional coupler according to some embodiments.

FIG. 4 shows a cross sectional view 400 of a dual directional coupler according to some embodiments. The cross sectional view 400 demonstrates a coupling method or technique employed in certain RF couplers herein. The view 400 is looking along the direction of the through line through the cross sectional area 400 indicated in FIG. 9. The view 400 shows a suspended stripline 408 including opposing conductive lines 401 and 403, and a via 402. As shown in FIG. 4, stripline 408 is formed on a suspended stripline substrate 407, and includes dielectric between the opposing conductive lines 401 and 403.

The view 400 further shows air 405 (or other non-conductive gas or vacuum) in a cavity, the suspended stripline substrate 407, a first microstrip coupling substrate 409, a second microstrip coupling substrate 411, a first grounded housing portion 413, a second grounded housing portion 415, a via and set of connectors 417, a second via and set of connectors 419, a reverse coupled microstrip line 203A, and a forward coupled microstrip line 205A.

In certain implementations, the conductive lines 401 and 403 are implemented as top and bottom traces on the surfaces of the suspended stripline substrate 407. For example, the conductive lines 401 and 403 can be laminated on the top and bottom of the suspended stripline substrate 407. The top and bottom conductive lines 401 and 403 can be connected by the vias 402. One or both of the conductive lines 401 and 403 operate as the through line (e.g., the through line 201 described with respect to FIG. 2). In certain implementations, the conductive lines 401 and 403 are connected together with a plurality of vias 402 (such as the plurality of vias 213 that run down the length of the through line 201 as shown in FIG. 2) to act as a through line that has about twice the size and volume of a single conductive line and that provides enhanced wave propagating characteristics, thereby allowing for greater power handling capability.

The high power signal propagates along the conductive lines 401 and 403 with an electric field extending relatively evenly in the top and bottom air cavities 405, and a magnetic field wraps around the conductive lines 401 and 403. This transverse electric magnetic field (TEM field) is weakly coupled onto the microstrip couplers 203A, 205A sampling the high power signal as a quasi TEM mode. By being positioned on both sides of the suspended stripline substrate 407, the TEM can propagate from the at least one of the through lines 401, 403 through the air 405 to the microstrip couplers 203A, 205A without passing through the suspended stripline substrate 407 or other material that reduces coupling or increases loss. As illustrated, a portion 401 of the suspended stripline 408 is on a side of the substrate 407 that faces the forward coupled microstrip line 205A, and a portion 403 of the suspended stripline 408 is on an opposite side of the substrate 407 that faces the reverse coupled microstrip line 203A. In the illustrated embodiment, the cavity can include air 405, a vacuum, or a non-conductive gas, which can better allow the TEM to propagate from the lines 401, 403 to the coupled microstrip lines 203A, 205A.

As shown in FIG. 4, the first microstrip coupling substrate 409 includes the coupled microstrip line 205A, dielectric 421, and a ground plane 423. The ground plane 423 electrically contacts the first grounded housing portion 413. The second microstrip coupling substrate 411 includes the coupled microstrip line 203A, dielectric 422, and a ground plane 424. The ground plane 424 electrically contacts the second grounded housing portion 415. In some embodiments, the housings 413, 415 can be used as ground planes that are coupled to the dielectrics 421, 424 in lieu of the ground planes 423, 424.

Accordingly, the first grounded housing portion 413 and the second grounded housing portion 415 correspond to the housing, in this embodiment. Furthermore, the first grounded housing portion 413 and the second grounded housing portion 415 are electrically connected to one another on either side through the vias and sets of connectors 417, 419. The vias and sets of connectors 417, 419 can include an electrically conductive via through the suspended stripline substrate 407 and pads or other conductive surfaces.

The reverse coupled microstrip line 203A and the forward coupled microstrip line 205A can be implemented as traces on the surfaces of the dielectrics 421, 422 of the microstrip coupling substrates 409, 411, respectively. The dielectrics 421, 422 can also be any insulating substrate including those described with respect to FIG. 5. In the cross sectional view 400 of the example dual directional coupler, the coupled microstrip lines 203A and 205A are a similar distance away from the through line. However, at a cross sectional view along a different portion of the example dual directional coupler, the coupled microstrip lines 203A and 205A might be at different positions such as 203B and 205B, respectively.

For example, in certain implementations, a microstrip transmission line includes two or more sections having different amounts of spacing to the suspended stripline. For example, the microstrip transmission line can include two or more steps to provide spacing that gradually increases (or decreases) along the length of the stripline, thereby enhancing directivity. In certain implementations, a pair of microstrip transmission lines are included, each having two or more sections with different spacing to the suspended stripline. Additionally, the spacing of a first microstrip transmission line of the pair gradually increases along the length of the stripline, while the spacing of a second microstrip transmission line of the pair gradually decreases along the length of the stripline. Implementing the microstrip transmission lines in this manner aids in detecting forward and reverse RF signal waves with enhanced directivity and/or accuracy.

Microstrip Couplers

Figure 5:
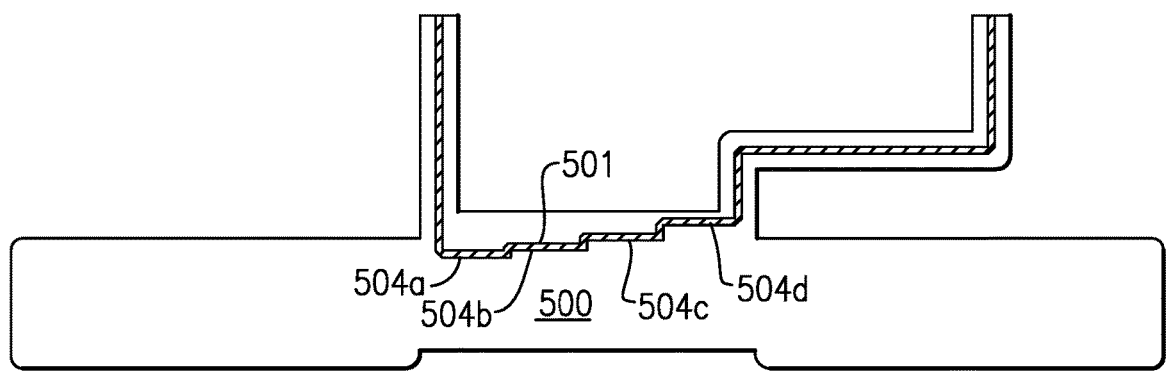
FIG. 5 shows an example of a microstrip coupling substrate and a coupled line on one side of the coupling substrate.

FIG. 5 shows an example of a microstrip coupling substrate 500 and a coupled line 501 (such as coupled line 203 or 205 of FIG. 2) on one side of the coupling substrate 500.

In the illustrated embodiment, the microstrip coupling substrate 500 can be made from about 5 mil (5 thousandths of an inch) thick Rogers duroid 5880 dielectric material, which can be plated with ¼ oz. copper for signal conductors and grounds. Rogers duroid 5880 is a polytetrafluoroethylene (PTFE) composite reinforced with glass microfibers. Other materials and thicknesses will be applicable.

The coupled line 501 can be a copper plated region that acts as a microstrip transmission line on one side of the microstrip coupling substrate 500. The other side of the microstrip coupling substrate 500 can have a continuous copper plated surface, acting as a ground plane. The bottom side of the substrate is not shown in this illustration but can be a continuous ground plane plated with copper.

In the illustrated embodiment, the microstrip transmission line 501 that is printed on the microstrip coupling substrate 500 has four equal length coupling sections 504a, 504b, 504c, 504d whose spacing away from the through line gradually increases, thereby providing relatively high directivity. The microstrip coupling substrate 500 can be laminated into the bottom of a slot cut in the plates using approximately 2 mil thick 5025E conductive sheet epoxy. Other materials and sizes can be used.

Two microstrip couplers 501 can be oriented in opposite directions to make power measurements of waves propagating along the through line in two directions, often referred to as the forward and reverse waves.

In some embodiments, the microstrip lines can be about 15 mils wide to provide a 50 Ohm impedance and can be arranged to be connected to coaxial connectors or even to power detecting circuitry. As illustrated, each microstrip coupler has a coupled port and an isolated port. The isolated port is intended to be terminated with a 50 Ohm load or other suitable system impedance to maintain high directivity. The length of each of the four sections is set at about a quarter wavelength at 13 GHz, and the spacing of the sections gradually increases along the direction of propagation of the wave being measured. Other designs can have additional sections with lengths at different fractions of a wavelength.

FIG. 6 illustrates an embodiment of an asymmetrical microstrip coupling line 600. The figure illustrates one example of the dimensions of an asymmetrical microstrip coupling line 600 (such as the coupled lines 203 or 205 of FIG. 2) described in Table 1 below. Other dimensions can be used in other microstrip coupling lines. Four sections 601, 602, 603, and 604 of the coupling line 600 are indicated. The width 611 of the coupling line 600 is about 15 mils. Each section 601, 602, 603, or 604 of the coupling line 600 is offset by a distance 612, 613, or 614 from an adjacent section 601, 602, 603, or 604. The distances 612, 613, and 614 can be distances farther away from a through line (not shown in FIG. 6). The substrate outline is omitted from this view, which only shows the top side trace. Alternate port numbers are shown in this illustration because the same substrate type can be installed on the top plate or the bottom plate to provide either forward of reverse coupling depending on the orientation.

In certain implementations, a width of each section controls a center frequency of the RF coupler. In one example, each section has a width of about ¼ a wavelength at the desired frequency of operation of the RF coupler. Accordingly, certain directional couplers herein advantageously have frequency characteristics that are tunable by selection of geometric features or dimensions.

Table 1 below shows an example spacing configuration between coupling sections of the example asymmetrical microstrip coupling line 600. This microstrip coupling line 600 can be selected for relatively good directivity characteristics with a relatively small number of sections. The relatively high directivity of this design can be used for distinguishing between forward and reverse waves on the through line, especially since the forward wave will be considerably higher in power than the reflected wave in a normal operating condition. In alternative embodiments, however, a symmetric design can be used. In alternative embodiments, other numbers of coupler sections can be used. For example, fewer coupler sections can be used for a 1 octave design, such as a 2-4 GHz design. Additional coupler sections (the "steps") can be used to extend the bandwidth.

TABLE 1

Coupler Section Spacing

| Coupler Section | Additional distance from previous coupler section (inches) | Distance from previous coupler section as a fraction of trace width |
|---|---|---|
| 601 | N/A | N/A |
| 602 | Distance 612: 15 mils | Distance 612: 1 Trace Width |
| 603 | Distance 613: 20 mils | Distance 613: 1.333 Trace Widths |
| 604 | Distance 614: 35 mils | Distance 614: 2.333 Trace Widths |

Suspended Air Stripline

Figure 7:
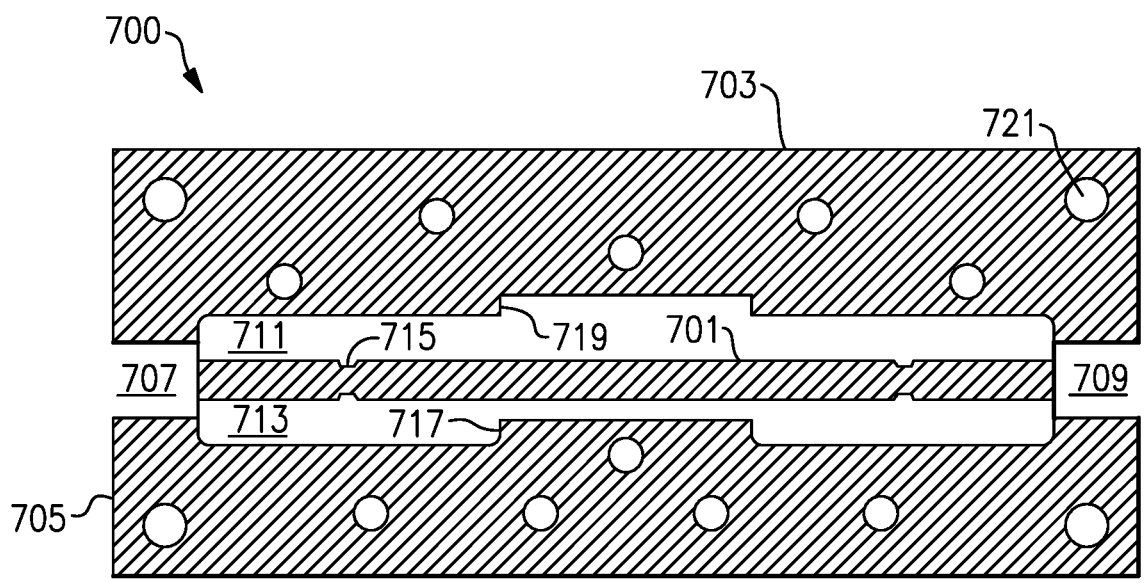
FIG. 7 shows a top view of a suspended air stripline substrate according to some embodiments.

FIG. 7 shows a top view of a suspended air stripline substrate 700 according to some embodiments. The substrate includes a conductive center trace 701, conductor pour areas 703 and 705, connection areas 707 and 709, non-conductive areas 711 and 713, notches 715 in the center trace 701, protrusion 717 and notch 719 in the conductor pour areas, and holes 721.

The trace 701 in the center is the through line (such as through line 201 of FIG. 2) which is suspended between two air cavities to operate as a suspended stripline. The trace 701 can be on both sides of the substrate 700 (such as shown in FIG. 4).

The conductor pour areas 703 and 705 are ground pours with plated through hole vias which provide low electrical resistance between the top and bottom machined plates.

In some embodiments, the suspended air stripline substrate 700 can be constructed from 10 mil thick Rogers 6035HTC (a ceramic-filled PTFE composite), and the trace 701 and/or the conductor pour areas can include 2 oz. copper plating. Other materials and thicknesses appropriate for high-power environments will be applicable.

The suspended air stripline substrate 700 can feature transmission lines on both sides of the stripline substrate 700 which are connected to each other with plated vias (for example, vias 213 of FIG. 2). Using a dual conductor configuration advantageously maintains symmetry of the electromagnetic field such that variation in the substrate thickness or dielectric constant has a negligible impact on performance. This configuration also has the added benefit of stability over temperature and provides relatively high quality factor for ultra-low through loss. Maintaining a relatively low through loss across the wide 2 to 18 GHz frequency range is useful for power handling since any through loss will translate to heat generated.

A non-conductive area 711 separates the center trace 701 from the pour area 703. A non-conductive area 713 separates the center trace 701 from the pour area 705. In some embodiments, the entire surface of the substrate 700 can be coated with a conductor, such as copper, and then the areas 711 and 713 can be etched away or otherwise removed to separate the center trace 701 from the pour areas 703, 705. In some embodiments, the non-conductive areas 711, 713 can include an insulator or dielectric.

Connectors, such as N-type connectors, can be connected at the connection areas 707 and 709 to connect to the center trace 701.

The center trace 701 can include notches 715 where the thermal shunts (shown in FIG. 8) are located. The positon and size of the notches can be configured to reduce the effect of the thermal shunts on transmission characteristics (such as maintaining a characteristic impedance of the through line).

The conductor pour area 705 can include a protrusion or protruding notch 717, and the conductor pour area 703 can include a corresponding receding notch 719. In certain implementations, the conductor pour areas 703 and 705 are grounded.

The receding notch 719 can be cut to create a space or a cavity for the coupled lines. If the cavity width becomes too large, then certain frequencies can resonate on the coupled lines and through line. To reduce the width, a protruding notch 717 can be positioned closer to the center trace 701 to prevent the frequencies from resonating. Cavity resonances occur when the frequency injected into the suspended stripline, approaches the $TE_{10}$ (transverse-electric$_{10}$) mode rectangular waveguide cutoff frequency.

Accordingly, the protruding notch 717 corresponds to some embodiments of a mode-suppression structure. When a stripline is suspended in a large cavity, higher mode resonances can result, which can degrade performance of the RF coupler. By including the protruding notch 717 or other suitable mode-suppression structure, frequency resonances are reduced or eliminated even when the receding notch 719 is present to provide sufficient space for the microstrip coupler. Thus, the protruding notch 717 effectively shifts the through line cavity, thereby reducing or eliminating frequency resonances while maintaining sufficient space for the microstrip coupler to couple the through line and maintain high directivity.

A number of holes 721 can be used to guide assembly and/or allow screws or pillars to fit through. Additionally or alternatively, one or more of the holes 721 can be used for mounting.

Figure 8:
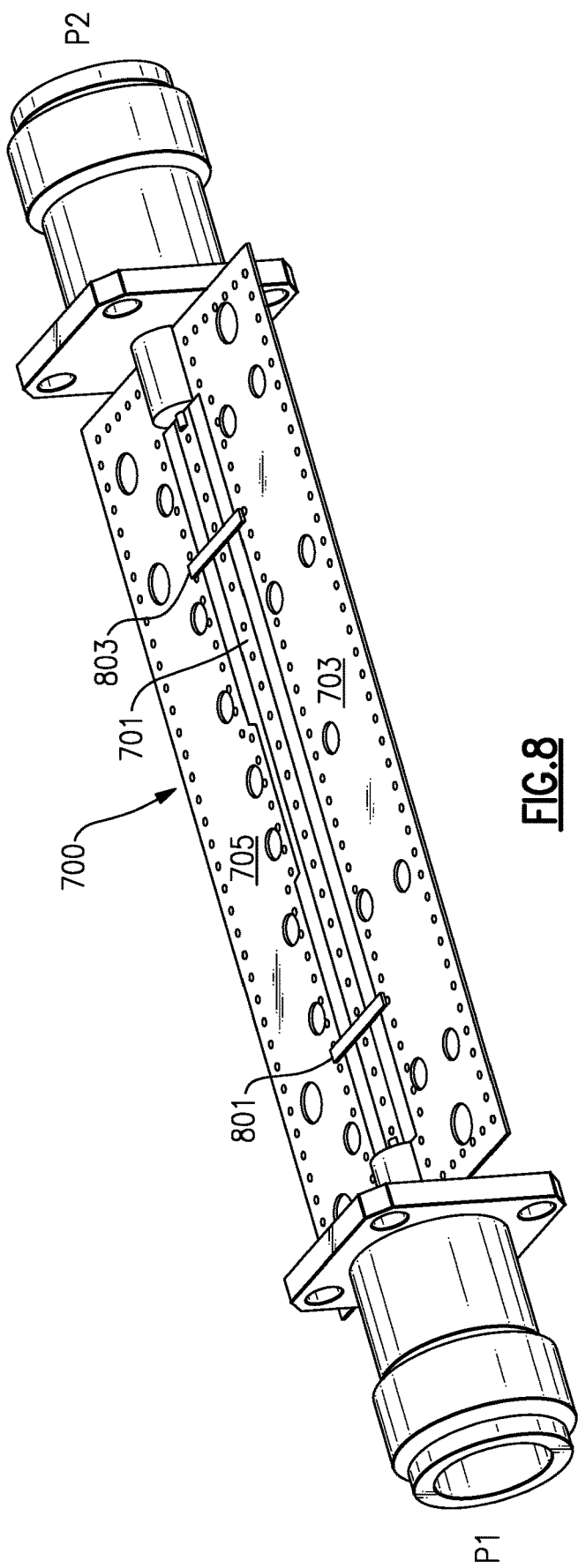
FIG. 8 shows an example suspended air stripline substrate with connectors and thermal shunts according to some embodiments.

FIG. 8 shows an example suspended air stripline substrate 700 with connectors and thermal shunts according to some embodiments. The example suspended air stripline substrate 700 (such as described with respect to FIG. 7) is depected with connectors P1, P2 and thermal shunts 801, 803 installed. To manage the heat generated in the through line in high average power applications, thermal shunts 801, 803 can be placed on either side of the center trace or strip 701. The thermal shunts can thermally couple the pour area 703 to pour area 705 without electrically coupling to the center strip 701.

In certain embodiments, the pour area 703 and the pour area 705 are electrically grounded and serve as ground planes.

In some examples, the thermal shunts 801, 803 are made from approximately 40 mil wide beryllium oxide ceramics, which have relatively high thermal conductivity and are electrically insulating. In some examples, the thermal shunts 801, 803 bridge over the center strip 701. Plating in select locations on the thermal shunts allows the thermal shunts to be soldered between the through line and a ground plane on the suspended stripline substrate. Other forms of attachment can alternatively be used. These thermal shunts 801, 803 electrically isolate the suspended stripline from the ground plane, while providing a relatively low thermal impedance path for heat generated to flow to the metal enclosure.

The suspended air stripline substrate 700 can be located in a cavity between the two housing plates (such as housing plates or parts 300 and 350 described with respect to FIG. 3). The substrate 700 can have a continuous copper pour with an array of plated vias to provide a low electrical resistance connection between the two housing plates. The ground pour is on both sides of the substrate, and can be located in all areas except where the slot is cut in the plates, in some embodiments.

As shown in FIG. 8, vias 813 are included in the center strip 701. In certain implementations, the coupled line includes conductors on opposing sides of a suspended stripline substrate, and the conductors are connected to one another by the vias 813. Vias 815 are also included in pour area 703 and pour area 705, thereby enhancing the robustness of the ground plane alongside the center strip 701 and aiding in heat dissipation of the thermal shunts 801.

FIG. 9 shows the exterior of an assembled dual directional coupler 900. The dual directional coupler 900 includes the housing plates 300 and 350 with holes 901 and with connectors for ports P1-P6. FIG. 9 also shows where the cross sectional view 200 of FIG. 2 and the cross sectional view 400 of FIG. 4 are taken.

To assemble the dual directional coupler 900, the housing plates 300 and 350 can be aligned with and used to sandwich the suspended air stripline substrate 700 shown in FIG. 8. The housing plates 300, 350 form a cavity that the suspended air stripline substrate 700 is suspended in with air (or other non-conductive gas or vaccuum) in the cavity above and below the center strip. The two housing plates 300, 350 which form the enclosure cavity can be mechanically connected together with screws or other connector hardware inserted into the holes 901. Other forms of attachment can be used. The assembled enclosure can be made of a metal or other conductor and shield the cavity inside the enclosure from external electromagnetic interference.

After assembly, for a dual directional coupler, there is a microstrip coupler on the top and a reversed direction microstrip coupler on the bottom of the cavity with the through line suspended in the center. In a single coupler variation, only one of the microstrip coupler on the top or the microstrip coupler on the bottom is used.

Figure 12:
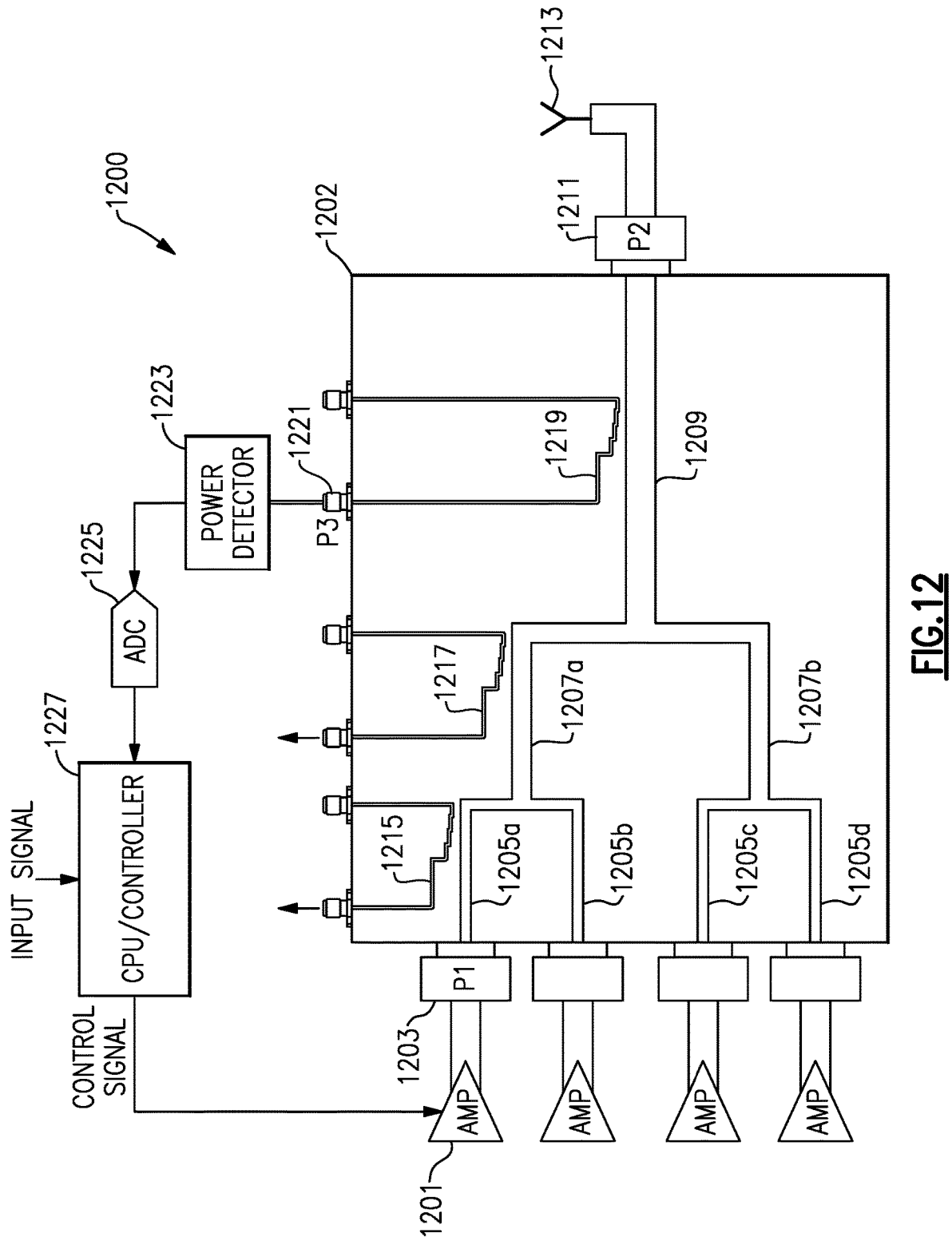
FIG. 12 shows some embodiments of a power combiner system with feedback control including a directional coupler.

The spacing and length of the coupling sections can be altered to change the coupling frequency range and the coupling factor. The 2 to 18 GHz high power suspended stripline to microstrip directional coupler in the illustrated example is set to a coupling factor of 40 dB. Other coupling factors can be used. A weak coupling of 40 dB is useful in relatively high power environments since the through path can have high power signals of up to +53 dBm on it, resulting in +13 dBm coupled signals which is towards the upper limit of many logarithmic power detectors. The weak coupling also serves to minimize the loss on the through path, since only a relatively small amount of power is being sampled from the original signal. An application block diagram for the broadband high power dual directional coupler can is shown in FIG. 12. This typical use is configured to measure the forward and reverse propagating waves from an amplifier and detecting them with logarithmic detectors or other suitable power detectors.

To achieve a weak coupling of 40 dB, the first microstrip coupling section is located about 100 mils from the center of the suspended stripline, and the final coupling section is located about 170 mils from center. The nominal width of the cavity is 280 mils and a 60 mil wide receding notch is cut in the housing to create space for the coupler. Increasing the cavity to 340 mils decreases the waveguide cutoff frequency and increases the likelihood of a resonance occurring, so a 35 mil wide resonance-cancelling protruding notch is added opposite the receding notch. Other dimensions can be used. The resonance suppression feature (for instance, the protruding and receding notches 717, 719 of FIG. 7) effectively shifts the through line cavity, and reduces or eliminates the waveguide cutoff frequency resonances while creating space for the microstrip coupler to weakly couple the through line and maintain high directivity between the forward and reverse propagating waves.

To prevent leakage between the forward and reverse microstrip couplers, the ground portion on the suspended stripline substrate can be used as an isolating ground plane. This way, the forward coupled, forward isolated, reverse coupled, and reverse isolated ports are relatively well shielded from each other.

Example Dimensions

Figure 10A:
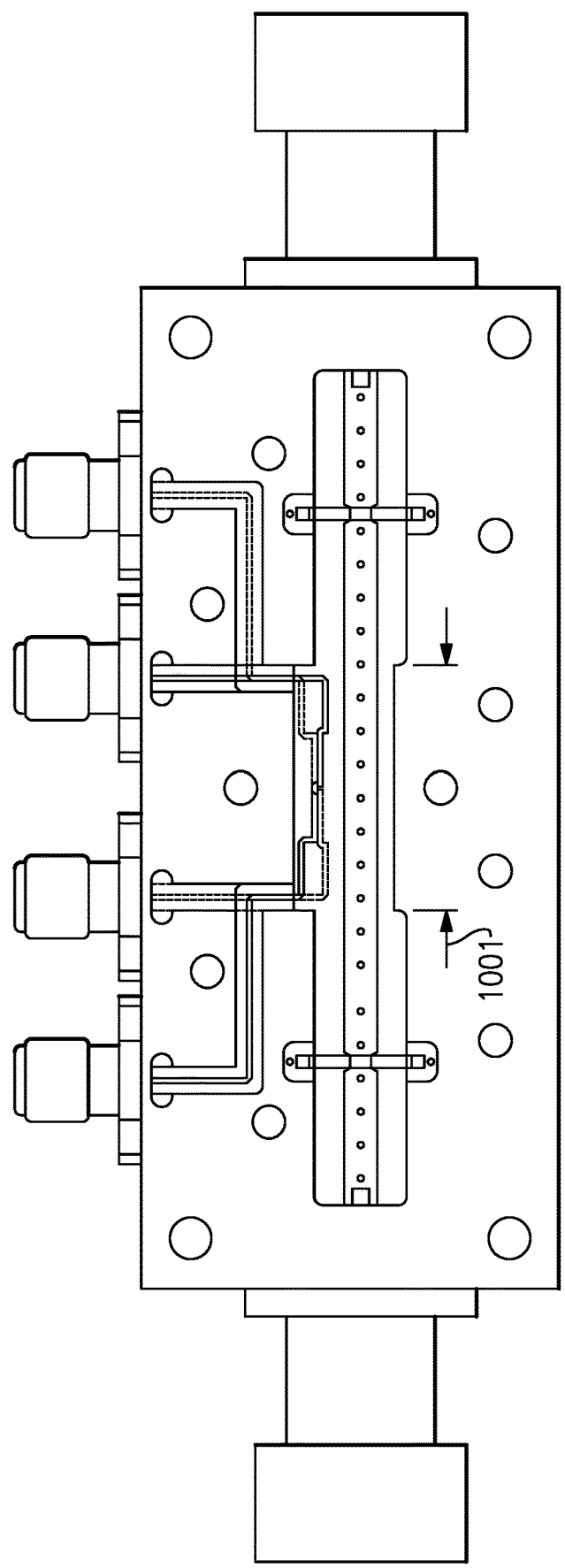
FIG. 10A shows an example dual directional coupler according to some embodiments.

FIG. 10A shows an example dual directional coupler 200 of FIG. 2 in an example embodiment where the total length 1001 of the four coupling sections in the 2-18 GHz broadband suspended stripline to microstrip dual directional coupler is about 0.735 inches long. This is the length 1001 of the coupling section of the design. The remaining area of the housing is to provide room for connectors and hardware.

FIG. 10B shows a perspective view of two microstrip coupling lines in an example dual directional coupler according to some embodiments. The relative positions of a first microstrip transmission line 1051 and a second microstrip transmission line 1053 are shown from a perspective view when assembled inside of a housing. The housing and other components inside the housing are drawn as transparent or omitted for clarity. The suspended stripline 1055 is also shown from the perspective view.

Figure 11:
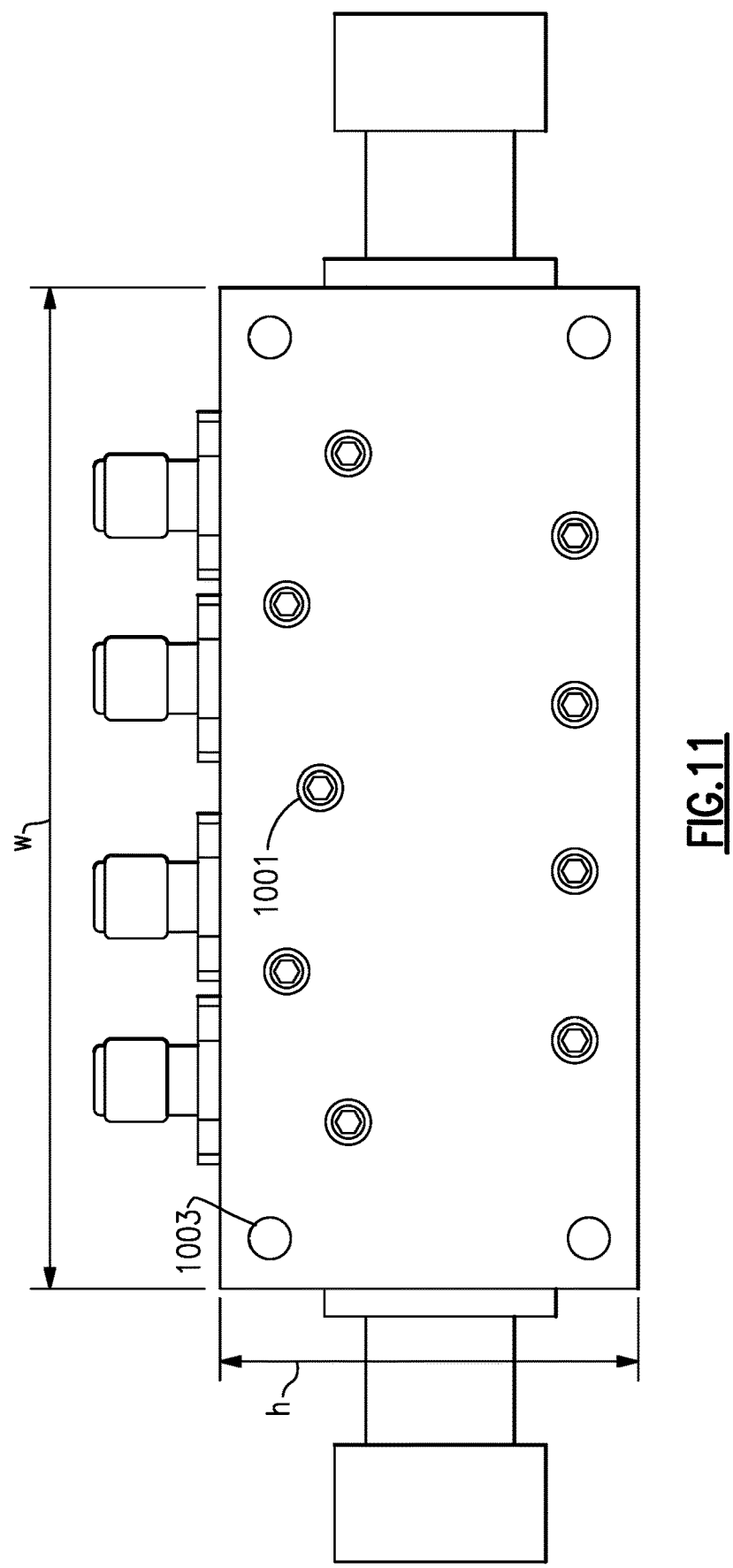
FIG. 11 shows an example of the dual directional coupler of FIG. 10 with external dimensions.

FIG. 11 shows an example of the dual directional coupler 200 of FIG. 10 with external dimensions. In addition to the parts shown in FIG. 10, FIG. 11 includes the external housing with connectors 1001 added, and the size increases to 3 inches wide×1.25 inches high×0.75 inches deep, which is advantageously considerably smaller than existing broadband dual directional couplers. Some of the holes 1001 can include connector hardware such as screws or bolts. Other circles 1003 can indicate guide holes used for mating a corresponding guide pillar from one housing through a corresponding hole in the other housing.

Example Systems

FIG. 12 shows an example power system 1200 with feedback control including a directional coupler. The power system 1200 includes a plurality of amplifiers 1201 (for instance, power amplifiers), a housing 1202, a plurality of input ports 1203, a plurality of first microstrip sections 1205a-1205d, a plurality of second microstrip sections 1207a-1207b, a third microstrip section 1209, an output port 1211, an antenna 1213, a microstrip of a first directional coupler 1215, a microstrip of a second directional coupler 1217, a microstrip of a third directional coupler 1219, a plurality of coupler ports 1221, a power detector 1223 (for instance, a log detector or other suitable power detector), an analog to digital converter (ADC) 1225, and a processor or controller 1227.

The plurality of amplifiers 1201 can provide RF power signals to be combined. For example, a maximum total output power provided to the antenna 1213 may exceed specified power outputs for an individual amplifier 1201. High power systems can operate with 100-300 Watts of continuous power or more. Although four amplifiers 1201 are shown, it will be understood that the system can include fewer (e.g., 2, 3) or greater (e.g., 5, 8, 10, 15, 16, or greater) numbers of amplifiers.

Each amplifier 1201 can provide an RF power signal through a respective input port 1203 (such as port P1 described with respect to FIG. 2) to a respective first microstrip section 1205a-1205f. A plurality of first microstrip sections 1205a-1205f can be implemented as suspended stripline sections including through lines that are configured to receive an RF power signal from a respective amplifier. Two or more of the first microstrip sections 1205a-1205f can combine to form respective second microstrip sections 1207a-1207b that can also be implemented as suspended stripline sections with through lines that are configured to conduct a combination of RF power signals. Although two first microstrip sections 1205a-1205f are shown as combining into a second microstrip section 1207a-1207b, any number of first microstrip sections 1205a-1205f can combine into a second microstrip section 1207a-1207b.

A plurality of the second microstrip sections 1207a-1207b can combine into a third microstrip section 1209 that can also be implemented as a suspended stripline including a through line. As illustrated, the RF power signals from all four amplifiers 1201 can combine in the third microstrip section 1209. Any number of second microstrip sections 1207a-1207b can combine into the third microstrip section 1209. In other variations, there can be fewer (e.g., 2) or more (e.g., 4, 5, 8, 10 or more) levels of microstrip sections. The third microstrip section 1209 provides the combined RF power signals to an output port 1211 (such as output port P2 discussed with respect to FIG. 2), which is coupled to an antenna 1213.

The housing 1202 can include a cavity (not shown) that the microstrip sections 1205a-1205f, 1207a-1207b, and 1209 are suspended in. The cavity of the housing 1202 can be similar to the cavity 301 of FIG. 3 and can be a single large cavity that encompasses the microstrip sections 1205a-1205f, 1207a-1207b, and 1209 and/or a plurality of smaller cavities that conform to the shape of the microstrip sections 1205a-1205f, 1207a-1207b, and 1209.

A first directional coupler 1215 is positioned to be TEM coupled to the first microstrip section 1205a-1205f. Although the first directional coupler 1215 is shown as one directional coupler, it will be understood that the opposite directional coupler can be additionally or alternatively coupled to the first microstrip section 1205a-1205f via a TEM field. Additional first directional couplers 1215 can be positioned for TEM coupling to any one, some, or all of the four first microstrip sections 1205a-1205f. A second directional coupler 1217 is positioned for coupling to the second microstrip section 1207a-1207b via a TEM field. Additional second directional couplers 1217 can be positioned for coupling to any one, some, or all of the second microstrip sections 1207a-1207b. A third directional coupler 1219 is positioned for coupling to the third microstrip section 1209 via a TEM field.

It will be understood that opposite directional couplers can be additionally or alternatively coupled to the second and third microstrip sections 1207a-1207b, 1209. Some variations can include fewer directional couplers, such as a directional coupler on only one or two out of the three microstrip sections 1205a-1205f, 1207a-1207b, 1209.

The third directional coupler 1219 is coupled to an port 1221 (such as port P3 shown described with respect to FIG. 2). An output and control system from the port 1221 will be described, but it will be understood that the output and control system can apply to one, some, or any combination of the couplers 1215, 1217, 1219. The output from the port 1221 is provided to a power detector 1223 (or any other type of signal detector), which can detect the weakly TEM coupled signal from the directional coupler 1219. The output of the power detector 1223 can be optionally amplified and provided to an ADC 1225, which can digitize the output of the power detector for providing to a processor or controller system 1227. In some embodiments, an analog signal can be provided to the controller system.

The processor or controller system 1227 can be configured to provide one or more control signals to adjust one or more of the amplifiers based on the output of the power detector and/or the input signal. The processor can include a CPU, microcontroller, or any other suitable processor. The controller can include components for any feedback and control system. The input signal can be a command or reference signal for controlling the power provided to the antenna. For example, the processor and/or controller 1227 can be configured to adjust a power, current, or voltage (e.g., via the amplifiers 1201), frequency, impedance, etc. (via control circuitry not shown) in response to outputs of the power detector indicating wave reflections. In some embodiments, the feedback from a first directional coupler 1215 can be used to adjust a power, current, voltage, and/or frequency of an RF power signal provided to the individual, corresponding input ports. Feedback from other directional couplers 1217, 1219 can be used to adjust a power, current, voltage, and/or frequency of an RF power signal provided to the corresponding plurality of input ports.

Example Flowcharts

Figure 13:
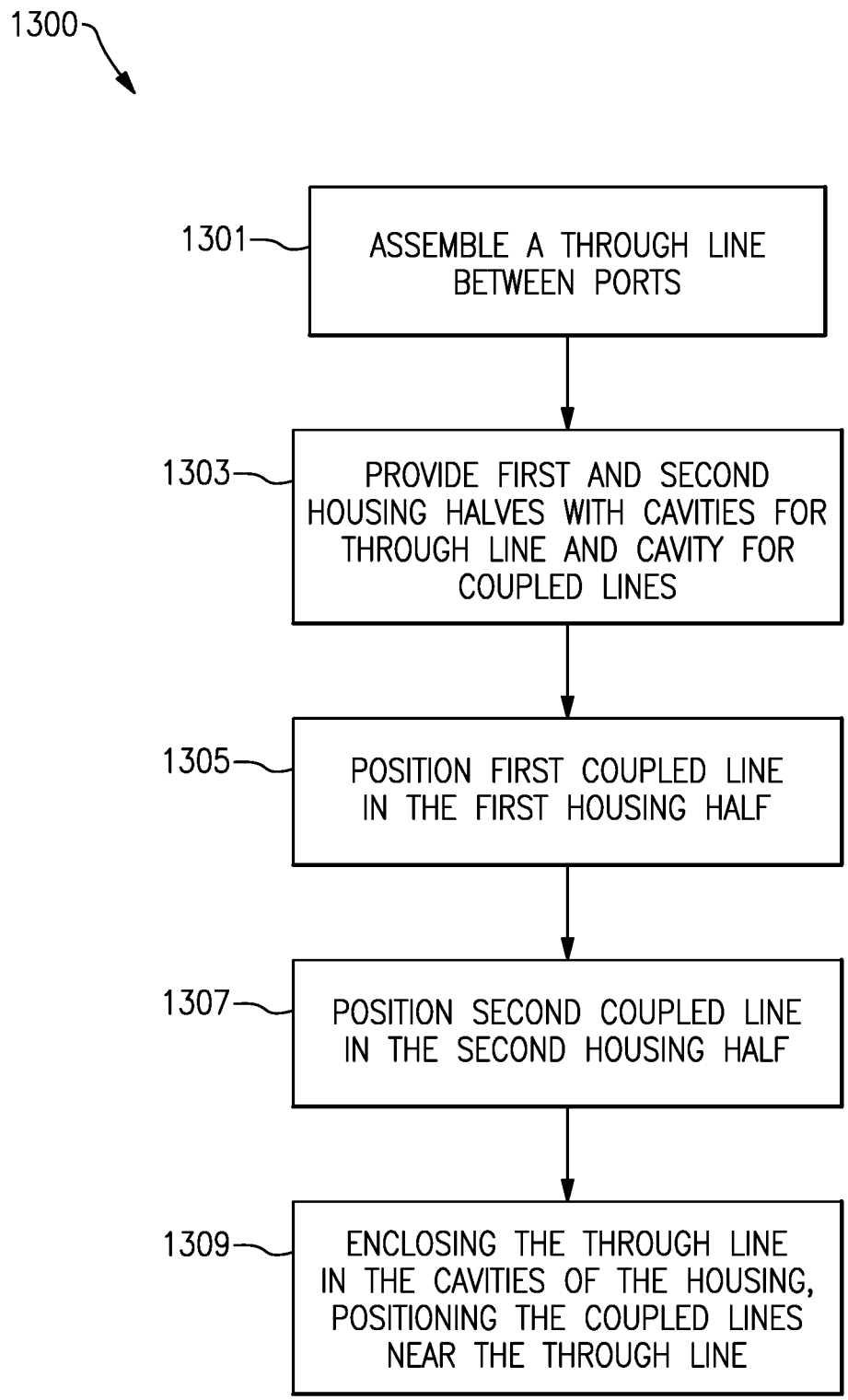
FIG. 13 shows an example of a flowchart for making a directional coupler.

FIG. 13 shows an example flowchart 1300 for making a directional coupler.

At block 1301, a through line can be assembled between two ports. The through line can be on a substrate such as shown in FIG. 4, FIG. 7, and FIG. 8.

At block 1303, first and second housings can be provided. The first and second housings can have a cavity for the through line and cavities for a coupled line, such as shown in FIG. 3. In certain implementations, the through line is a stripline. The first and second housings can have asymmetric cavities (such as the stair step design) for coupled lines to be in different directions from each other when assembled.

At block 1305, a first coupled line can be positioned in the first housing half, such as shown in FIG. 3. In certain implementations, the first coupled line is a microstrip transmission line.

At block 1307, a second coupled line can be positioned in the second housing half. For example, the second coupled line can be positioned in a housing in the opposite direction shown in FIG. 3. In certain implementations, the second coupled line is a microstrip transmission line.

At block 1309, the housings can be placed to enclose the through line in the main cavity of the housings, such as shown in FIG. 9. In the enclosed housings, the coupled lines can be close enough to the through line to be coupled via a TEM field. Air in the cavities can separate the through lines from the coupled lines.

Figure 14:
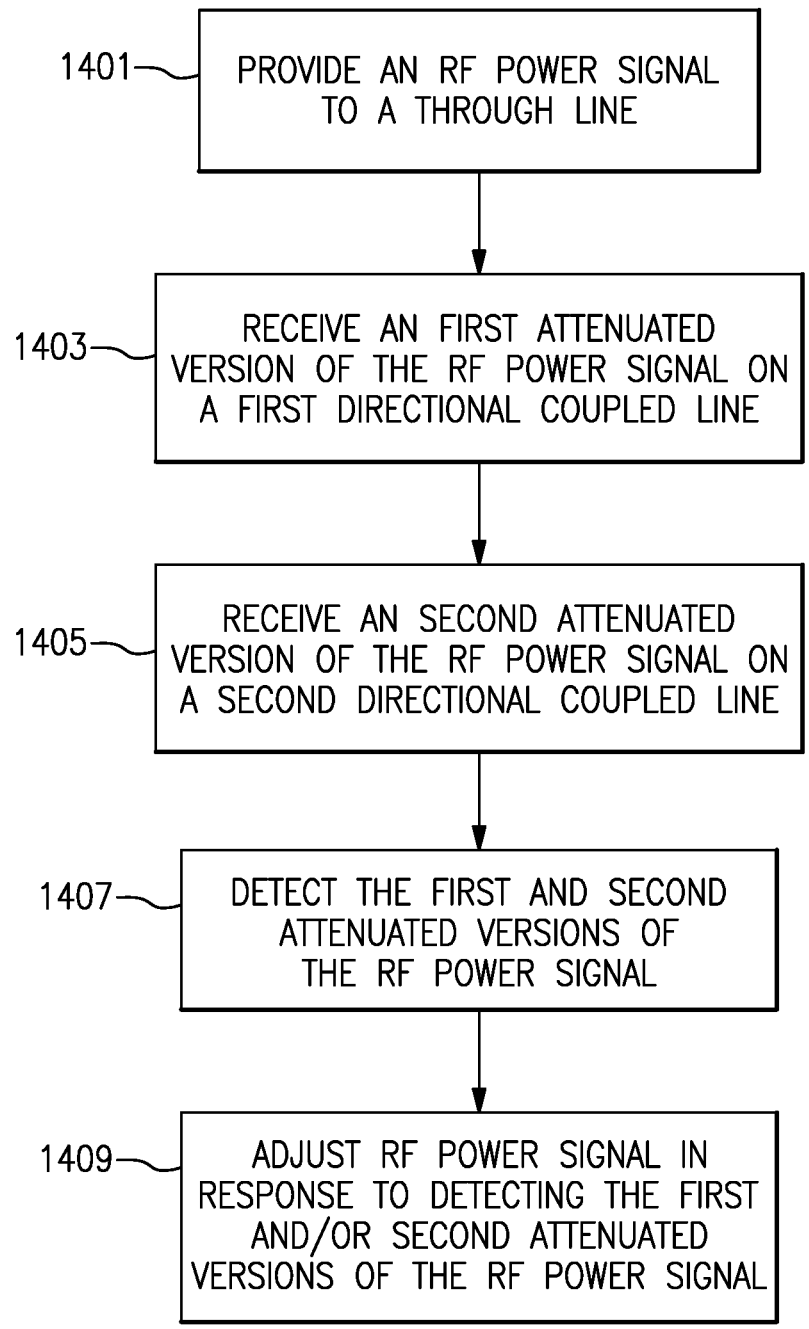
FIG. 14 shows an example flowchart for using a directional coupler.

FIG. 14 shows an example flowchart 1400 for using a directional coupler.

At block 1400, an RF power signal can be provided to a through line. The RF power signal can be, for example, high power signals in the 2-18 GHz range. In certain implementations, the through line is a stripline.

At block 1403, a first attenuated version of the RF power signal can be received on a first directional coupled line. The first directional coupled line can be separated from the through line by air in a cavity of a housing. The first directional coupled line can be asymmetrical along the direction of the through line. In certain implementations, the first directional coupled line is a microstrip transmission line.

At block 1405, a second attenuated version of the RF power signal can be received on a second directional coupled line. In certain implementations, the second directional coupled line is a microstrip transmission line. The second directional coupled line can be separated from the through line by air in a cavity of a housing. The second directional coupled line can be asymmetrical along the direction of the through line and arranged in an opposite direction from the first directional coupled line.

At block 1407, the first and second attenuated versions of the RF power signal can be detected, such as by using a logarithmic detector or other type of signal detector.

At block 1409, the RF power signal can be adjusted based at least in part on the detected versions of the first and second RF power signals.

Example Graphs

Figure 15:
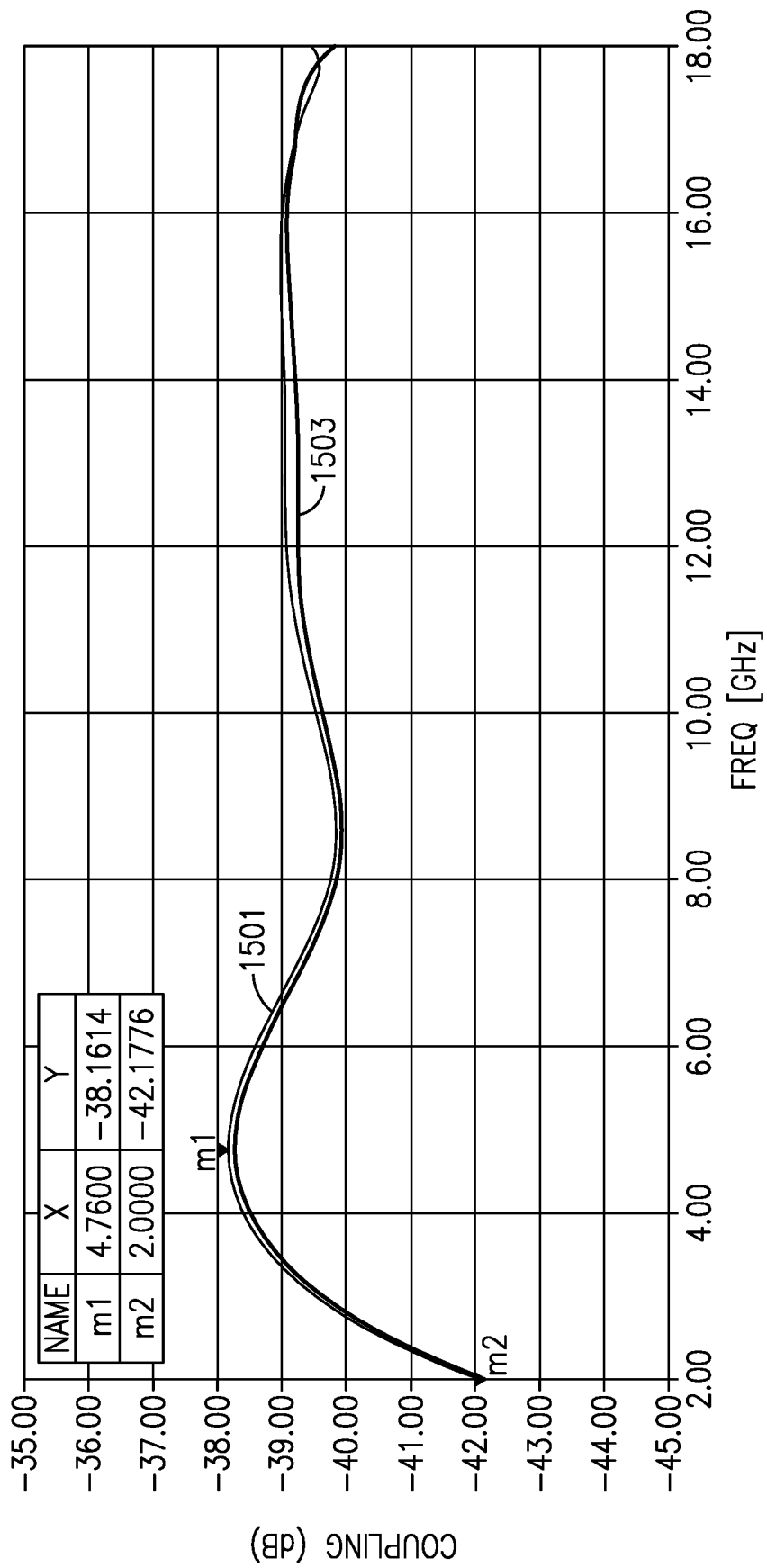
FIG. 15 shows a graph of coupling across a range of frequencies for an example directional coupler.

FIG. 15 shows an example graph simulating coupling (in dB) across a range of frequencies from 2.00 GHz to 18.00 GHz for an example broadband RF coupler. A first curve 1501 represents the coupling of a first microstrip line forward coupled to a through line, and a second curve 1503 represents the coupling of a second microstrip line reverse coupled to the through line. Marker m1 indicates a local maximum coupling of about −38.1614 dB at about 4.76 GHz. Marker m2 indicates a local minimum coupling of about −42.1176 dB at about 2.00 GHz. Accordingly, it can be seen that the coupling flatness of less than about 4 dB is achieved across the frequency range of about 2.00 GHz to about 18.00 GHz.

Figure 16:
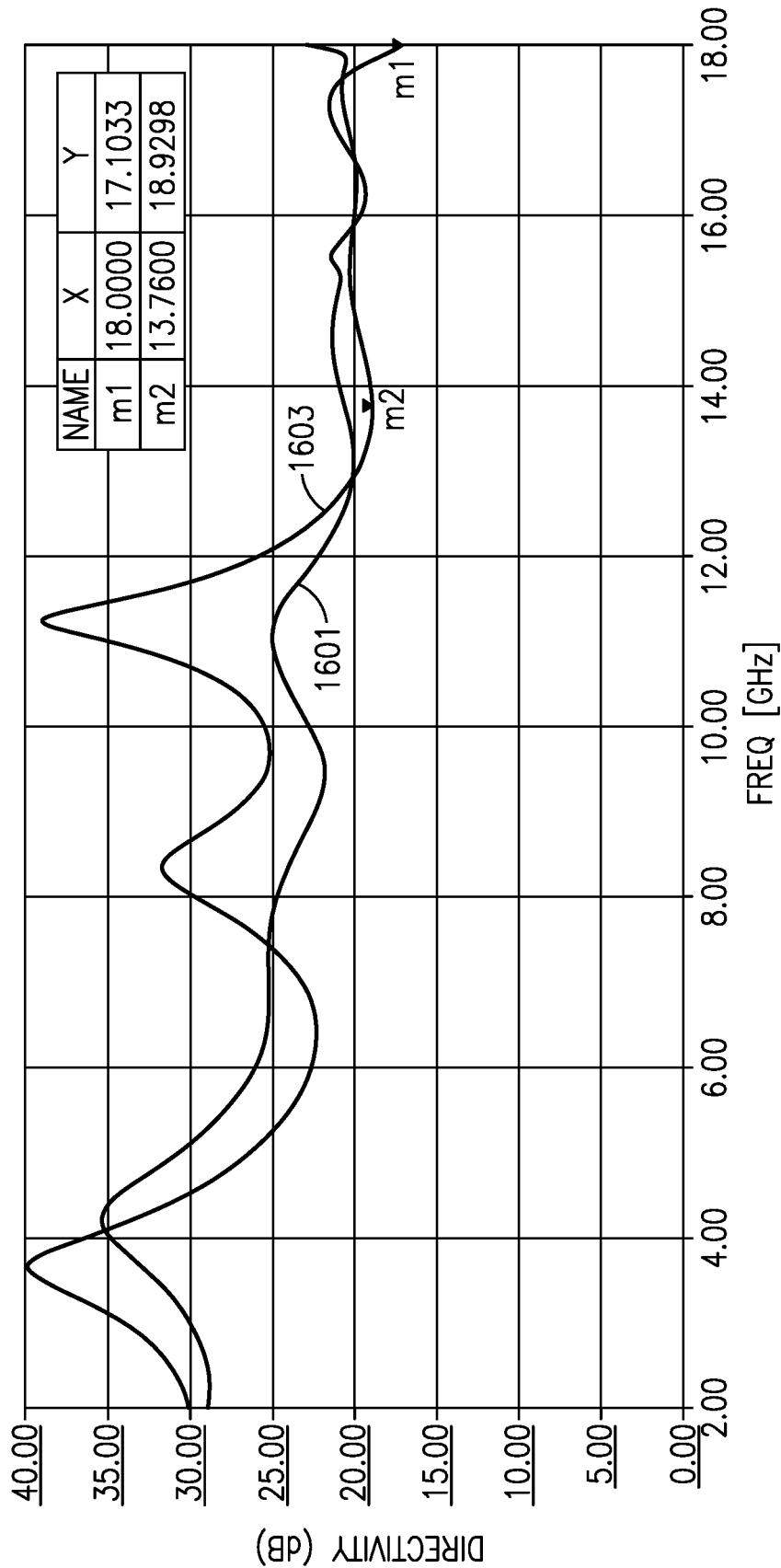
FIG. 16 shows a graph of directivity across a range of frequencies for an example directional coupler.

FIG. 16 shows an example simulation graph simulating directivity (in dB) across a range of frequencies from 2.00 GHz to 18.00 GHz for an example broadband RF coupler. A first curve 1601 represents the directivity of a first microstrip line forward coupled to a through line, and a second curve 1603 represents the directivity of a second microstrip line reverse coupled to the through line. Marker m1 indicates a local minimum directivity of about 17.1033 dB at about 18.00 GHz. Marker m2 indicates a local minimum directivity of about 18.9298 dB at about 13.76 GHz. Accordingly, it can be seen a minimum directivity of about at least 17 dB can be achieved across the frequency range of about 2.00 GHz to about 18.00 GHz.

Figure 17:
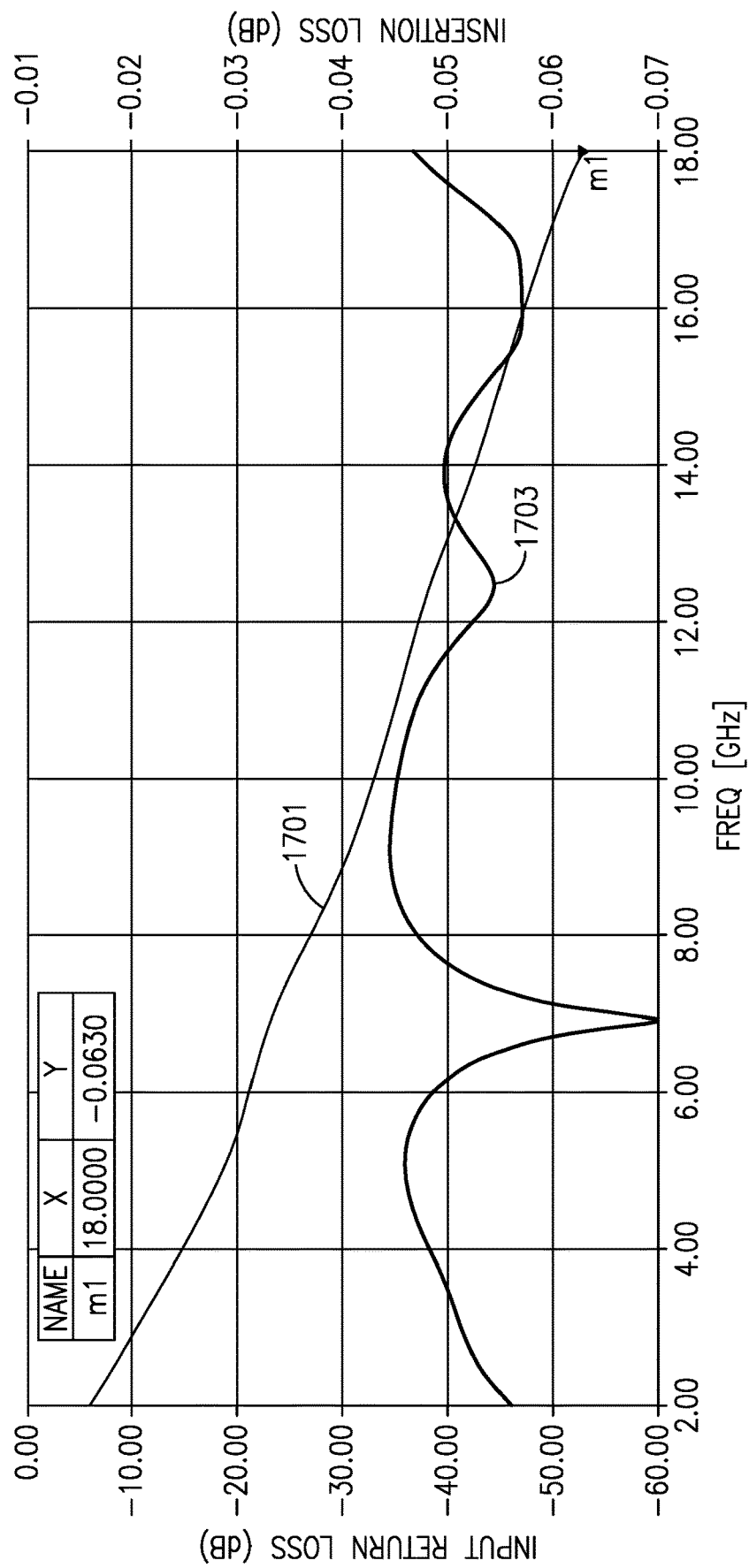
FIG. 17 shows a graph of losses across a range of frequencies for an example directional coupler.

FIG. 17 shows an example graph simulating through loss or insertion loss (in dB) and return loss (in dB) across a range of frequencies from 2.00 GHz to 18.00 GHz for an example broadband RF coupler. A first curve 1701 represents the insertion loss of the through line, and a second curve 1703 represents the return loss of the through line. Marker m1 indicates the local minimum insertion loss of about −0.063 dB at about 18.00 GHz. The input return loss remains less than about −34 dB across the frequency range.

Additional Details

Various embodiments have been described above. For example, fewer than four coupling sections (such as two or three) can be used in environments with narrower band, such as, but not limited to, 6-18 GHz. Although described with reference to these specific embodiments, the descriptions are intended to be illustrative and are not intended to be limiting. Various modifications and applications may occur to those skilled in the art.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog-to-digital converters, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, and disk driver circuits. Consumer electronic products can include, but are not limited to, wireless devices, a mobile phone (for example, a smart phone), healthcare monitoring devices, vehicular electronics systems such as automotive electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products. Further, products can include high-voltage applications such as vehicle control circuits in cars, radars, actuators in heavy or industrial machinery, aerospace technology, defense or military electronics, equipment for electronic warfare and for communications, etc. Industrial and consumer electronic products, such as for cell phone base stations, can also be applicable. The teachings of the inventions provided herein can be applied to other systems, not necessarily the systems described above. The elements and acts of the various embodiments described above can be combined to provide further embodiments.

The foregoing description and following claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error. Some discussions of the circuit and principles may make simplifying assumptions and estimates for clarity and to improve understanding.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements, and/or states.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

The invention claimed is:

1. An apparatus for coupling radio frequency (RF) signals with low through loss and high bandwidth, the apparatus comprising:
   a housing including a cavity;
   a substrate assembly comprising a dielectric substrate and a through line formed on the dielectric substrate and configured to carry a first RF signal, wherein at least a portion of the through line is suspended within the cavity of the housing; and
   a first coupled line within the cavity, but spaced apart from the substrate assembly by at least a portion of the cavity, the first coupled line arranged in a microstrip configuration with a dielectric and a ground plane facing away from the first coupled line, wherein the first coupled line is electromagnetically coupled to the through line such that the first coupled line carries a second RF signal corresponding to an attenuated version of the first RF signal, wherein the first coupled line includes two or more steps operable to provide RF coupling across two or more octaves of frequency.

2. The apparatus of claim 1, wherein the two or more steps are asymmetric for directional coupling.

3. An apparatus for coupling radio frequency (RF) signals with low through loss and high bandwidth, the apparatus comprising:
   a housing;
   a substrate disposed within a cavity of the housing;
   a suspended stripline coupled to the substrate, the suspended stripline also disposed within the cavity of the housing; and
   a first microstrip coupler disposed within the cavity, wherein the first microstrip coupler is electromagnetically coupled to the suspended stripline and spaced apart from the suspended stripline by a gap, and wherein at least a portion of the suspended stripline is on a side of the substrate that faces the first microstrip coupler,
   wherein a first dielectric substrate for the suspended stripline and a second dielectric substrate for the first microstrip coupler have different dielectric constants.

4. The apparatus of claim 3, wherein the first microstrip coupler has one or more steps for multi-octave RF coupling.

5. The apparatus of claim 3, wherein the first microstrip coupler is a directional coupler.

6. The apparatus of claim 3, wherein the first microstrip coupler is coupled in a forward direction, the apparatus further comprising a second microstrip coupler disposed within the cavity, wherein the second microstrip coupler is electromagnetically coupled to the suspended stripline in a reverse direction.

7. The apparatus of claim 3, further comprising a detector coupled to the first microstrip coupler.

8. An apparatus for coupling radio frequency (RF) signals with low through loss and high bandwidth, the apparatus comprising:
   a housing including an enclosed cavity;
   a substrate assembly comprising a dielectric substrate and a through line formed on the dielectric substrate and configured to carry a first RF signal, wherein at least a portion of the through line is suspended within the enclosed cavity of the housing, wherein the housing encloses each side of the through line and serves as a ground plane, and wherein the enclosed cavity is dimensioned to set a waveguide cutoff frequency; and
   a first coupled line within the enclosed cavity, but spaced apart from the substrate assembly by at least a portion of the enclosed cavity, the first coupled line arranged in a microstrip configuration with a dielectric and a ground conductor, wherein the first coupled line is electromagnetically coupled to the through line such that the first coupled line carries a second RF signal corresponding to an attenuated version of the first RF signal.

9. The apparatus of claim 8, wherein the first coupled line includes two or more sections each spaced apart from the through line by different distances.

10. The apparatus of claim 8, wherein the first coupled line is configured to carry the first RF signal in a transverse electromagnetic (TEM) mode.

11. The apparatus of claim 8, further comprising a second coupled line within the enclosed cavity, but spaced apart from the substrate assembly, wherein the second coupled line is arranged in a second microstrip configuration and electromagnetically coupled to the through line, wherein the through line is positioned between the first coupled line and the second coupled line.

12. The apparatus of claim 8, wherein the substrate assembly further comprises a thermal shunt configured to draw heat away from the through line.

13. The apparatus of claim 12, wherein the through line includes a region of narrow width configured to compensate for a variation in characteristic impedance arising from presence of the thermal shunt.

14. The apparatus of claim 8, wherein at least a portion of the housing comprises an electrically conductive material such that the enclosed cavity of the housing is shielded, and wherein the enclosed cavity is an air cavity.

15. The apparatus of claim 10, wherein the first coupled line is configured to sample the first RF signal as a quasi TEM mode.

16. The apparatus of claim 8, wherein the through line comprises a first conductor on a first side of the dielectric substrate, a second conductor on a second side of the dielectric substrate, and a plurality of vias electrically connecting the first conductor to the second conductor.

17. The apparatus of claim 8, wherein the first coupled line is positioned at least in part in a notch in the housing, wherein the housing further includes a protrusion on a side of the substrate assembly opposite the notch and operable to suppress resonances.

18. The apparatus of claim 8, further comprising:
one or more N-type connectors mechanically attached to the housing and electrically connected to the through line; and
one or more SubMiniature version A connectors mechanically attached to the housing and electrically connected to the first coupled line.

19. The apparatus of claim 8, wherein the first coupled line is coupled to a power detector.

20. The apparatus of claim 8, wherein the housing comprises a mode-suppression structure configured to suppress higher mode resonances in the enclosed cavity.

* * * * *